United States Patent [19]

Miyoshi

[11] Patent Number: 5,562,382
[45] Date of Patent: Oct. 8, 1996

[54] SUBSTRATE TRANSPORT APPARATUS AND SUBSTRATE TRANSPORT PATH ADJUSTMENT METHOD

[75] Inventor: Hideaki Miyoshi, Tokyo, Japan

[73] Assignee: Kaijo Corporation, Tokyo, Japan

[21] Appl. No.: 277,427

[22] Filed: Jul. 18, 1994

[51] Int. Cl.⁶ ............................................... B65G 49/07
[52] U.S. Cl. ........................... 414/222; 414/331; 414/750
[58] Field of Search ........................... 414/222, 331, 414/609, 750; 198/817

[56] References Cited

U.S. PATENT DOCUMENTS

| | | | |
|---|---|---|---|
| 4,378,482 | 3/1983 | Tucker | 414/750 X |
| 4,457,662 | 7/1984 | Ireland et al. | 414/331 |
| 4,631,812 | 12/1986 | Young | 198/817 X |
| 4,704,792 | 11/1987 | Itagaki et al. | 414/222 X |
| 4,725,182 | 2/1988 | Sakamoto et al. | 414/331 |
| 5,145,055 | 9/1992 | Kondo | 198/817 X |
| 5,302,077 | 4/1994 | Sato et al. | 414/331 X |
| 5,437,359 | 8/1995 | Maruyama et al. | 414/750 X |

FOREIGN PATENT DOCUMENTS 3279103  12/1991  Japan ....................... 198/817

*Primary Examiner*—James W. Keenan
*Attorney, Agent, or Firm*—Sughrue, Mion, Zinn, Macpeak & Seas

[57] ABSTRACT

A substrate transport apparatus and substrate transport path adjustment method are described which allow adjustment of the transport path of a substrate to be completed by placing a magazine between regulating members for regulating the position of the magazine provided roughly in a straight line with respect to guide members which guide a substrate along a prescribed path, positioning the magazine with respect to the prescribed path by moving both regulating members in synchronization and in the same direction after causing the regulating members to engage with the magazine by moving them relatively in the direction in which they approach each other, pushing the substrate out from the magazine to bring it between the guide members, and causing the guide members to approach the substrate. In addition, after causing the guide members to relatively approach each other, and positioning the substrate with respect to the prescribed path by moving the guide members in synchronization and in the same direction, each of the regulating members are caused to approach each other and be positioned at a regulating position corresponding to this positioned substrate. Moveover, after the substrate is arranged between the guide members, and corresponding guide members are moved relatively in the direction in which they approach each other by driving devices to engage with the substrate, both the guide members are moved in synchronization and in the same direction to position the substrate with respect to the prescribed path.

10 Claims, 38 Drawing Sheets

PRIOR ART

SUBSTRATE TRANSPORT APPARATUS AND SUBSTRATE TRANSPORT PATH ADJUSTMENT METHOD

BACKGROUND OF THE INVENTION

1. Field of the Invention

The present invention relates to a substrate transport apparatus which transports flat substrates, and an adjustment method of a substrate transport path in said apparatus.

2. Description of the Prior Art

An example of this type of substrate transport apparatus of the prior art is that provided in a wire bonder, an example of which is shown in FIGS. 1 through 3. Furthermore, since said apparatus is disclosed in, for example, Utility Model Laid-Open Publication No. 3-48225, the following explanation is limited to its essential portion only.

In said Wire bonded, substrates in the form of a plurality of lead frames L/F, on which are respectively mounted a plurality of IC chips (semiconductors) 1 in a row in the lengthwise direction, are arranged and contained in a substrate containment device in the form of magazine M, and this magazine M is loaded onto loader 2. These lead frames L/F are sequentially removed from magazine M by a frame feeding device not shown accompanying operation of said loader 2, intermittently fed at intervals of the arrangement pitch of IC chips 1, and transported onto heater plate 5 which is heated by heater block 4 (see FIG. 3). On said heater plate 5, each IC chip 1 mounted on said lead frame L/F and lead 8 formed on said lead frame (see FIG. 2) are sequentially connected by bonding using a conductive wire by bonding device 7.

Those lead frames L/F on which the above-mentioned bonding has been performed are further fed backward by the above-mentioned frame feeding device and contained in empty magazine M loaded on unloader 9.

A transport path that performs high-precision transport to prevent snaking of lead frames L/F transported by the above-mentioned frame feeding device is set, and said transport path is demarcated by guide members in the form of a pair Of guide rails 11 and 12 arranged corresponding to both sides of lead frames L/F.

Furthermore, following completion of wire bonding, an indentation is formed in lead frame L/F as shown in FIG. 3 for the purpose of reducing the thickness of finished products in the form of semiconductor components obtained by plastic molding and so forth, and IC chips 1 are mounted using said indentation in the form of island 13. The above-mentioned transport path is particularly important for positioning said island 13 with respect to indentation 5a provided in heater plate 5 so that said island 13 is aligned during bonding work.

However, since lead frames L/F have various widths corresponding to the type of IC chip 1 which is to be mounted, the interval between both guide rails 11 and 12 is adjustable to allow guiding of these various types of lead frames. More specifically, as shown in FIG. 2, a pair of frame bases 15 are fixed on the frame of the wire bonder (not shown), and each guide rail 11 and 12 is attached to a slider 16 able to slide freely along a rail portion provided on each frame base 15.

Guide member driving devices 17 are provided for moving each of both guide rails 11 and 12. As a result, both guide rails 11 and 12 are made to approach and move away from lead frame L/F by the operation of said guide member driving devices 17. Furthermore, said guide member driving devices 17 are composed of pulse motors 18a and 18b mounted on the above-mentioned frame bases 15, male screws 19 coupled to the output shafts of said pulse motors, and nuts 20 fastened to both guide rails 11 and 12 which screw onto said male screws 19.

The following provides an explanation of loader 2 and unloader 9 arranged so as to be located on both sides of the above-mentioned guide rails 11 and 12. Furthermore, since loader 2 and unloader 9 mutually have similar constitutions, a detailed explanation is provided only for the constitution of loader 2, with that for unloader 9 omitted.

As shown in FIG. 1, loader 2 has an elevator mechanism 22 for lowering or raising magazine M at intervals of the arrangement pitch of lead frames L/F in order to take out a plurality of lead frames L/F arranged and contained in said magazine M one at a time using the above-mentioned frame feeding device (not shown), and elevator mechanism base 23 equipped with said elevator mechanism 22. This elevator mechanism base 23 moves in the direction shown by arrow S, namely the direction parallel to direction of movement T of the above-mentioned both guide rails 11 and 12, and its position can be adjusted in said direction S by turning knob 25.

A pair of stocker guides 27a and 27b, formed to each have a cross-section in the shape of the letter "L", are provided on elevator mechanism base 23. One stocker guide 27a is fixed on elevator mechanism base 23, while the position of the other stocker guide 27b can be adjusted in the direction shown by arrow U, namely the lengthwise direction of magazine M.

Two each, for a total of four, regulating members 28a to 28d are attached to the insides of both of the above-mentioned stocker guides 27a and 27b. These regulating members 28a–28d engage with magazine M to regulate its movement. Two regulating members 28a and 28b are each fastened to stocker guides 27a and 27b, while the position of the other two regulating members 28c and 28d can be adjusted in the direction shown by arrow V, namely the direction of the width of magazine M.

The following provides an explanation of the operation in the case of performing adjustment of the transport apparatus so as to match the width of the lead frames L/F to be handled in the apparatus having the above-mentioned constitution.

To begin with, pulse motors 18a and 18b (see FIG. 2) are rotated and driven based on a command signal emitted from a controller (not shown) consisting of a microcomputer and so forth. The amount of rotation of said pulse motors is converted into the amount of advance or regression of nuts 20 resulting in both guide rails 11 and 12 moving to the movement limit positions in the direction in which they move away from each other.

Next, a single lead frame L/F for adjustment of the transport path is handled by an operator, and a reference hole (not shown) formed in said lead frame L/F is fit onto a projection (not shown) serving as a reference provided on heater plate 5. As a result, island 13 formed in lead frame L/F on which IC chip 1 is mounted aligns with indentation 5a (see FIG. 3) of heater plate 5.

Furthermore, as shown in FIG. 2, lead frame L/F is held by pressing from above by lead frame clamp 29, and bonding origin 30 is set in the center of IC chip 1 and island 13 through opening 29a of said lead frame clamp 29 by operating bonding device 7 (shown in FIG. 1).

Following this procedure, pulse motors 18a and 18b are rotated in reverse so that both guide rails 11 and 12 approach lead frame L/F. Moreover, the gaps between the sides of both said guide rails and lead frame L/F are set to an optimum value.

Next, magazine M, containing a large number of the above-mentioned lead frames L/F, is loaded on loader 2 and the position of said magazine M is regulated by an operator manually performing each of the positional adjustments of stocker guide 27b and regulating members 28c and 28d. Furthermore, at this time, the position of said regulated magazine M is adjusted in the direction of width so that lead frames L/F pushed out from this magazine M smoothly enter between both guide rails 11 and 12. This positional adjustment is performed by an operator suitably turning knob 25 (see FIG. 1) to adjust the position of elevator mechanism base 23 equipped with each of the above-mentioned regulating members. In addition, aside from the above procedure, adjustment is made to provide clearance between each of regulating members 28a to 28d and magazine M so that raising and lowering operation of magazine M by elevator mechanism 22 is performed smoothly.

On the other hand, adjustment similar to that of the above-mentioned loader 2 is also performed for unloader 9.

This then completes adjustment of the transport path.

Although above-mentioned adjustment of the transport path is performed to adjust the intervals between guide rails 11 and 12 and regulating members 28a to 28d corresponding to changes in the type of lead frame L/F (magazine M) to be transported, aside from said adjustment, during replacement of heater plate 5, adjustment of the transport path following a procedure similar to that described above is also performed in the case relative displacement occurs between indentation 5a, for fitting with the island, provided on heater plate 5 and island 13. However, in this case, instead of adjusting the intervals between the guide rails and regulating members, both guide rails 11 and 12 and all regulating members 28a to 28d are shifted in position in the same direction by the amount of the above-mentioned relative displacement to align island 13 with the above-mentioned indentation 5a. Furthermore, in order to shift all regulating members 28a to 28d in the same direction, knob 25 (see FIG. 1) must be suitably turned by an operator, and the position of elevator mechanism base 23, on which each of said regulating members is equipped, must be adjusted.

As described above, in the substrate transport apparatus and substrate transport path adjustment method of the prior art, adjustment work must be performed manually by an operator to align indentation 5a of heater plate 5 with island 13 of a lead frame L/F to be transported whenever the type of said lead frame L/F changes or heater plate 5 is replaced, thus resulting in the disadvantage of creating tedious and complicated work for the operator and consuming much time.

SUMMARY OF THE INVENTION

As a result of consideration of the above-mentioned disadvantages of the prior art, the object of the present invention is to provide a substrate transport apparatus and substrate transport path adjustment method which allows adjustment of the transport path to be completed both quickly and easily.

The substrate transport apparatus according to the present invention is composed of: guide members, able to freely approach and move away from each other, arranged corresponding to both sides of a substrate so as to guide said substrate along a prescribed path; guide member driving devices which move each of said guide members; a first detection device which detects that said guide members have engaged with said substrate and have reached a state wherein they are able to guide said substrate; regulating members arranged in the direction of substrate guiding of each of said guide members which regulate the position of a substrate containment device by mutually approaching and moving away; regulating member driving devices which move each of said regulating members; and, a second detection device which detects that said regulating members have regulated the position of said substrate containment device.

In addition, the substrate transport path adjustment method according to the present invention consists of causing regulating members, arranged in the direction of substrate guiding of guide members which guide a substrate along a prescribed path and which regulate the position of a substrate containment device by freely approaching and moving away from each other, to respectively and relatively approach each other, positioning said substrate containment device with respect to said prescribed path by moving each of said regulating members in the same direction in synchronization, and causing said guide members to approach said substrate pushed out from said substrate containment device between said guide members.

Moreover, the substrate transport apparatus according to the present invention is composed of: guide members, able to freely approach and move away from each other, arranged corresponding to both sides of a substrate so as to guide said substrate along a prescribed path; guide member driving devices which move each of said guide members; a first detection device which detects that said guide members have engaged with said substrate and have reached a state wherein they are able to guide said substrate; regulating members arranged in the direction of substrate guiding of each of said guide members which regulate the position of a substrate containment device by mutually approaching and moving away; regulating member driving devices which move each of said regulating members; and, a second detection device which detects that said regulating members have reached a position where they are able to regulate the position of said substrate containment device; wherein, said guide members and regulating members are composed so that a first positioning is performed by said guide members, and a second positioning is performed with respect to said regulating members based on the position of said guide members.

In addition, the substrate transport path adjustment method according to the present invention consists of causing guide members, arranged corresponding to both sides of a substrate so as to guide said substrate along a prescribed path and which are able to freely approach and move away from each other, to respectively and relatively approach each other, positioning said substrate with respect to said prescribed path by moving each of said guide members in the same direction in synchronization, and causing regulating members, arranged in the direction of substrate guiding of said guide members which regulate the position of a substrate containment device by freely approaching and moving away from each other, to approach each other and be positioned at a regulating position corresponding to this positioned substrate.

Moreover, the substrate transport path adjustment method according to the present invention consists of arranging a substrate between guide members, arranged corresponding to both sides a said substrate so as to guide said substrate along a prescribed path and which are made to approach and move away from said substrate by driving devices, moving at least one of either of said guide members towards the other guide member by using said driving device, engaging each of said guide members with said substrate, and moving both of said guide members in the same direction in synchronization to position said substrate with respect to said prescribed path.

DESCRIPTION OF THE PREFERRED EMBODIMENTS

The following provides an explanation of the preferred embodiments of the present invention. First of all, an explanation is provided regarding a wire bonding apparatus equipped with a substrate transport apparatus as a first embodiment of the present invention based on FIGS. 4 and 5.

Figure 1:
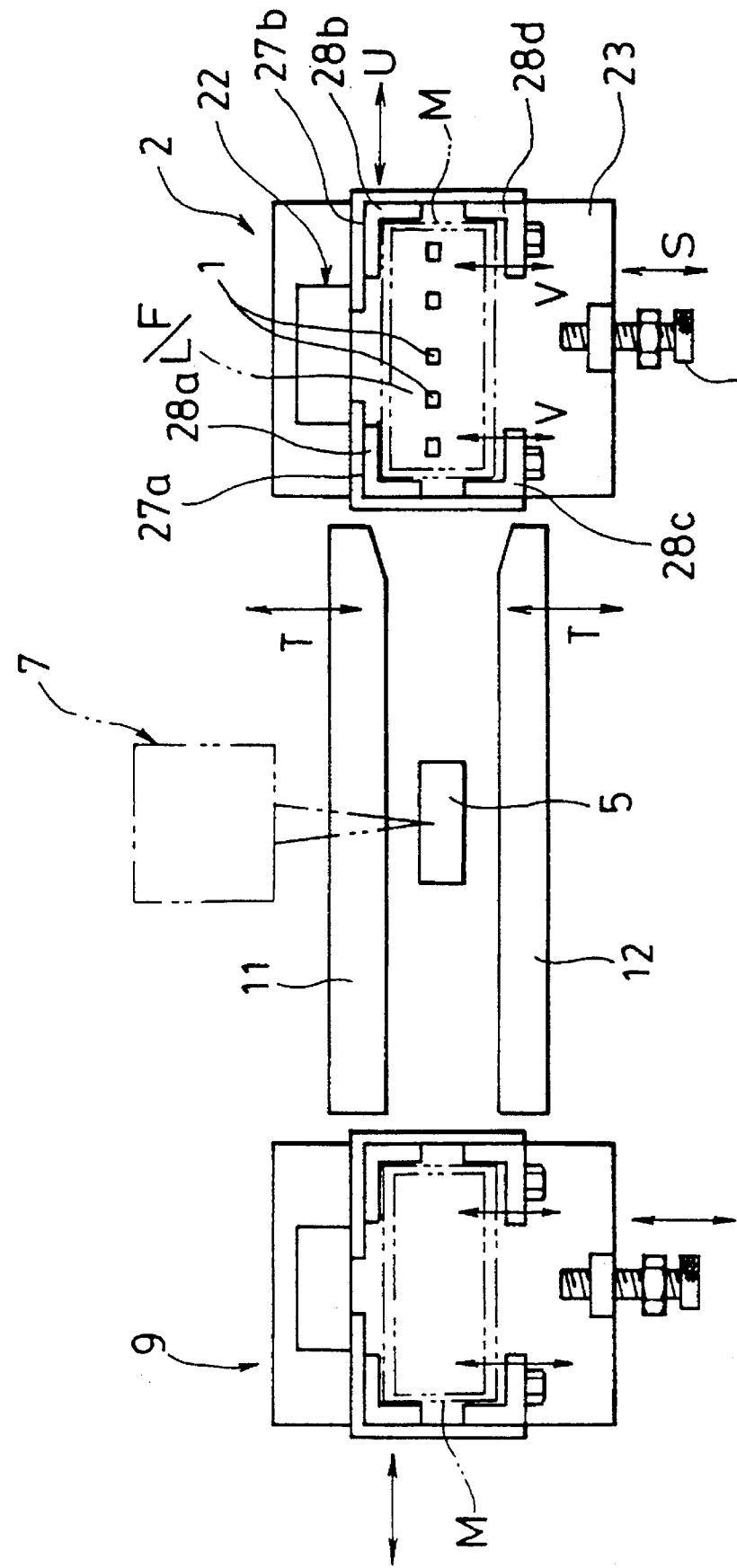
FIG. 1 is an overhead view of the essential portion of a wire bonding apparatus containing a substrate transport apparatus of the prior art.
Figure 2:
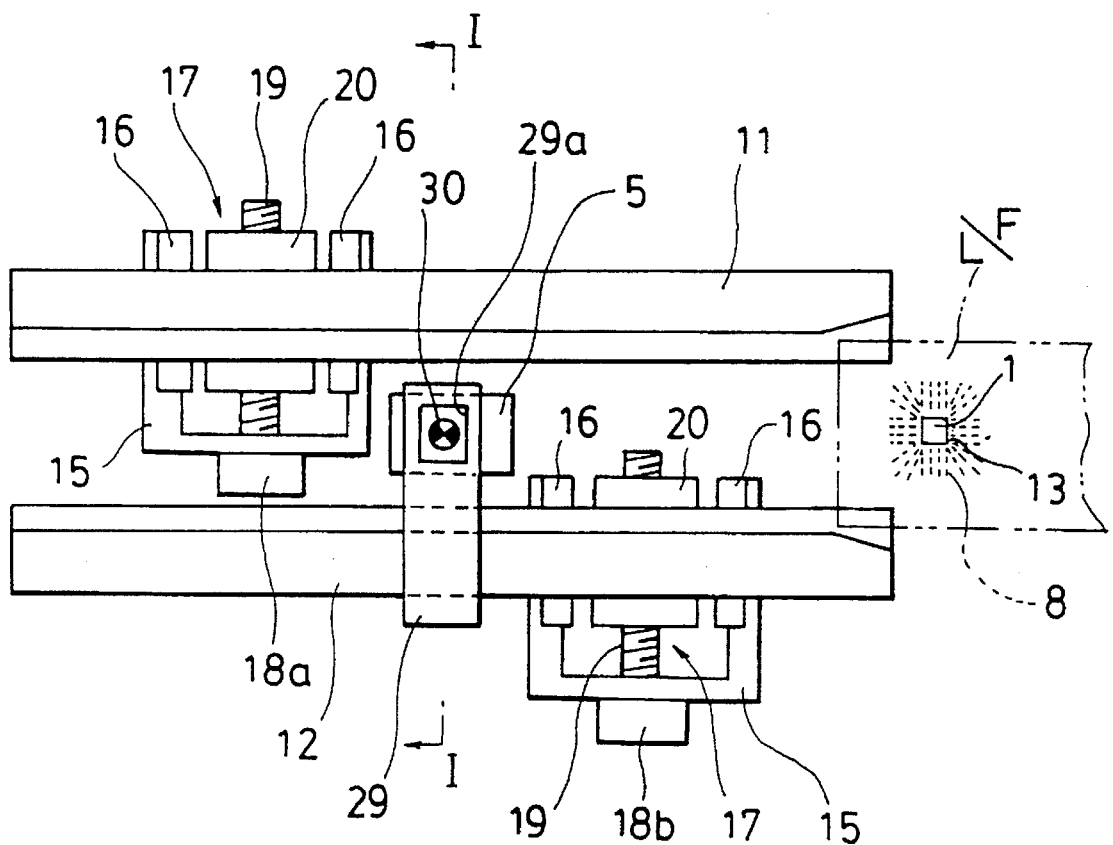
FIG. 2 is an overhead view of a portion of the apparatus shown in FIG. 1.
Figure 3:
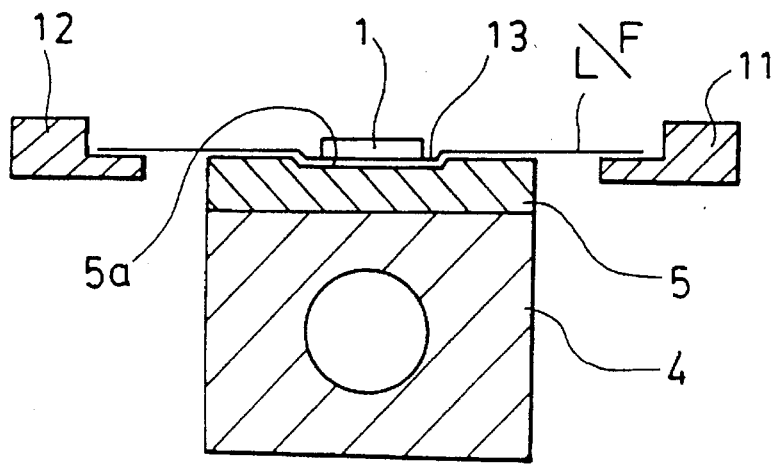
FIG. 3 is a view taken along arrows I—I in FIG. 2.
Figure 4:
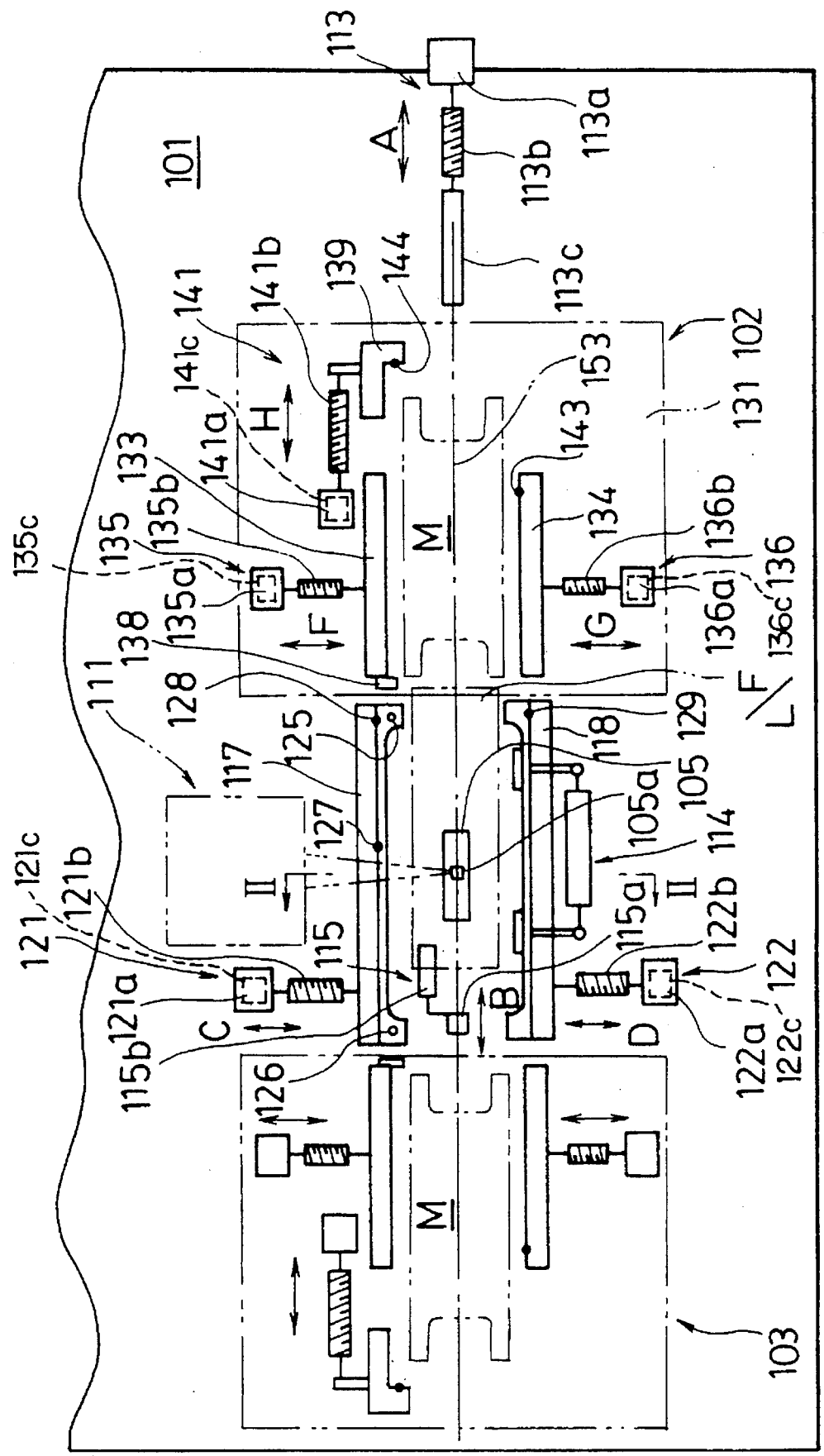
FIG. 4 is an overhead view of the essential portion of a wire bonding apparatus containing a substrate transport apparatus as a first embodiment of the present invention.

As shown in FIG. 4, in said wire bonding apparatus, loader 102 and unloader 103, respectively loaded with magazines M, are provided on frame 101 of said apparatus. Furthermore, each magazine M functions as a substrate containment device which arranges and contains a plurality of substrates in the form of lead frames L/F, and is freely attached and removed from loader 102 and unloader 103. In addition, lead frames on which bonding has yet to be performed are contained in magazine M loaded on loader 102, while lead frames on which bonding has been performed are contained in magazine M on unloader 103.

Figure 5:
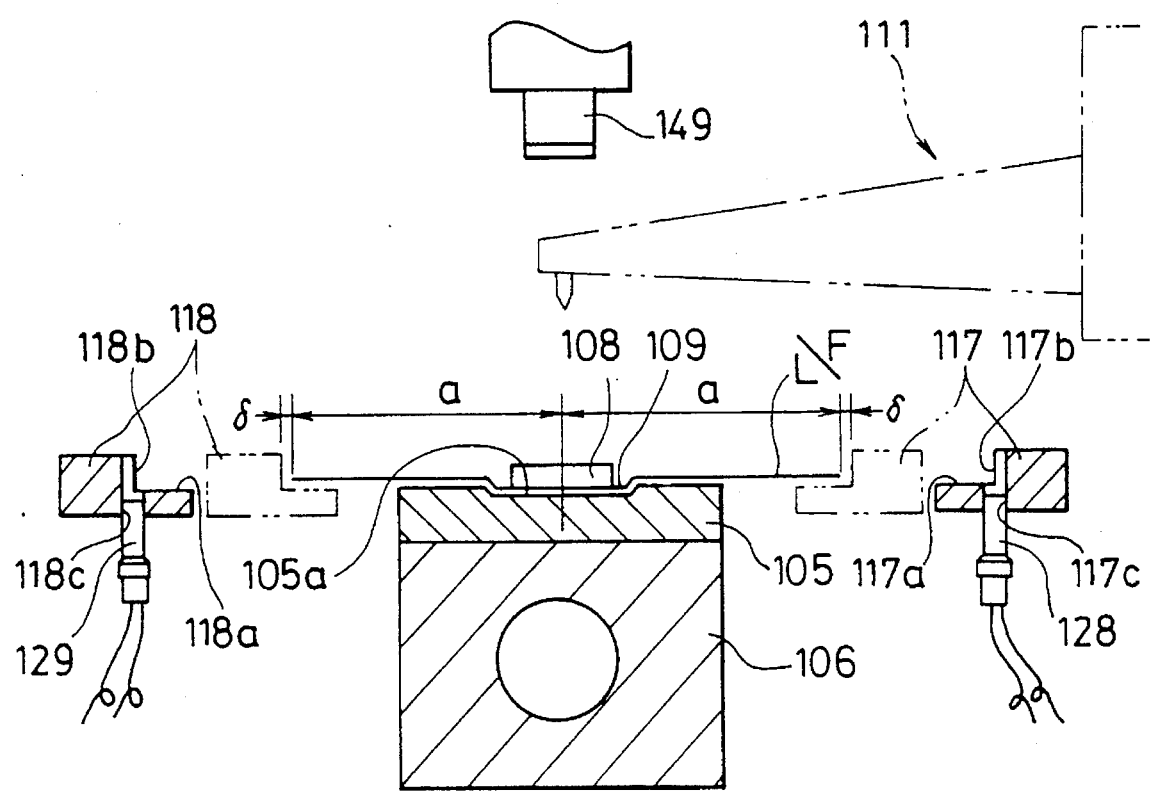
FIG. 5 is a view taken along arrows II—II relating to FIG. 4.

Heater plate 105 is arranged at a position between loader 102 and unloader 103. As shown in FIG. 5, this heater plate 105 is heated by heater block 106, and holds lead frames L/F supplied by magazine M on loader 102. As shown in FIG. 5, IC chips (semiconductor) 108 are mounted on lead frame L/F. More specifically, a plurality are mounted arranged in a row in the lengthwise direction (direction perpendicular to the surface of the paper in the drawing) of said lead frame L/F.

In addition, as shown in FIG. 5, an indentation is formed in lead frame L/F, and IC chip 108 is mounted using said indentation in the form of island 109. The constitution of this concave island is employed for the purpose of reducing the thickness of finished products in the form of semiconductor components obtained by performing plastic molding and so forth following completion of bonding. Accordingly, as shown in the drawing, indentation 105a (also shown in FIG. 4) is formed in heater plate 105 so that said island 109 fits in said indentation 105a during bonding work.

As shown in FIGS. 4 and 5, bonding device 111 is provided above heater plate 105. This bonding device 111 bonds a lead 110 (see FIG. 16) formed on lead frame L/F positioned on said heater plate 105 to an IC chip 108 mounted on said lead frame L/F using a conductive wire.

As shown in FIG. 4, pushing mechanism 113 is arranged in front of loader 102 which pushes out one lead frame L/F inside magazine M loaded on said loader 102 one at a time accompanying operation of said loader 102. Said pushing mechanism 113 is composed of motor 113a, male screw 113b rotated and driven by said motor 113a, and pusher 113c equipped with a nut (not shown) that screws onto said male screw, and which moves back and forth in the direction of arrow A by rotation of said male screw 113b to engage with the rear end of lead frame L/F when moving forward to push said lead frame L/F outside of magazine M.

In addition, feed mechanism 114 is provided on the side of heater plate 105 which brings lead frame L/F pushed outside of magazine M on loader 102 by the above-mentioned pushing mechanism 113 onto said heater plate 105, and further feeds it to the vicinity of magazine M on unloader 103.

In addition, pushing mechanism 115 is provided behind heater plate 105 which contains lead frame L/F, fed to the vicinity of magazine M on unloader 103 by the above-mentioned feed mechanism 114, within said magazine M. This pushing mechanism 115 is composed of pusher 115a, which engages with the rear end of lead frame L/F and pushes it, and cylinder 115b, which moves said pusher 115a back and forth as indicated with arrow B.

The above-mentioned pushing mechanism 113, pushing mechanism 115 and feed mechanism 114 are collectively referred to as a frame feeding device.

A transport path is provided to prevent snaking of lead frames L/F transported from magazine M on loader 102 to magazine M on unloader 103 by the above-mentioned frame feeding device, and transport said lead frames L/F with high accuracy. Said transport path is demarcated by a pair of guide members in the form of guide rails 117 and 118 arranged corresponding to both sides of transported lead frames L/F.

Both the above-mentioned guide rails 117 and 118 are able to relatively and freely approach and move away from each other as shown with arrows C and D so as to be able to accommodate various types of lead frames having mutually different dimensions of width. Guide member driving devices 121 and 122 are provided for respectively moving both said guide rails 117 and 118. Both guide rails 117 and 118 are made to approach and move away from lead frames L/F by the operation of both said guide member driving devices 121 and 122. These guide member driving devices 121 and 122 are composed of pulse motors 121a and 122a fixed on frame 101 of the apparatus, male screws 121b and 122b turned as a result of being coupled to the output shaft of each said pulse motor, and nuts (not shown) fastened to both guide rails 117 and 118 and respectively screwed on to each said male screw 121b and 122b.

Various types of sensors 125 to 129 are provided on both the above-mentioned guide rails 117 and 118. These sensors are composed of, for example, reflective optical sensors.

Sensors 125 provided near the front end of guide rail 117 is for detecting whether the lead frame L/F on which bonding is to be performed has been pushed out from magazine M on loader 102 by the operation of pushing mechanism 113, namely whether that lead frame L/F is present. In addition, sensor 126 arranged near the rear end of guide rail 117 is provided to confirm whether lead frame L/F for which bonding has been completed has been transported from heater plate 105 by pushing mechanism 115, namely whether that lead frame L/F has been contained in magazine M on unloader 103. Sensor 127 provided on guide rail 117 so as to be positioned to the side of heater plate 105 is for confirming the position of the lead frame L/F on said heater plate 105.

The remaining two sensors 128 and 129 are for detecting that guide rails 117 and 118 have engaged with lead frame L/F and reached the state of being able to guide said lead frame L/F. These sensors are collectively referred to as a first detection device. More specifically, as shown in FIG. 5, guide rails 117 and 118 have two receiving surfaces 117a, 117b, 118a and 118b each mutually positioned at a right angle so as to respectively make contact with the lower surface and side edge of lead frame L/F. Both sensors 128 and 129 are arranged so that irradiated light emitted by said sensors 128 and 129 as well as reflected light from lead frame L/F are positioned in a plane that contains vertical receiving surfaces 117b and 118b. Consequently, apertures 117c and 118c opened at the intersecting portions of receiving surfaces 117a and 117b as well as 118a and 118b are formed in both guide rails 117 and 118, and sensors 128 and 129 are inserted into these apertures 117c and 118c.

Furthermore, the above-mentioned sensor 125 also has the action of detecting that lead frame L/F to be guided by both guide rails 117 and 118 has arrived between these guide rails, and more particularly, that said lead frame L/F has reached the position at which detection by each of the above-mentioned sensors 128 and 129 is possible.

In addition, if pulse motors 121a and 122a serving as driving force generation devices respectively possessed by guide member driving devices 121 and 122 for moving the above-mentioned guide rails 117 and 118, respectively, are equipped with signal generation devices 121c and 122c, respectively, in the form of encoders which emit pulse signals corresponding to their respective amounts of operation, namely the angles of rotation, use of each of the above-mentioned sensors 128 and 129 no longer becomes necessary. Namely, since both guide rails 117 and 118 are not able to move further once they have respectively engaged with lead frames L/F and pinched them from both sides, pulse signals are no longer obtained from the above-mentioned encoders when in this state. Thus, the pulse motors are stopped by detecting this state. Furthermore, in consideration of each pulse motor continuing to rotate excessively for several pulses due to its inertia at this time, it is preferable to rotate each pulse motor in reverse by the same number of excess pulses after stopping.

Next, the following provides an explanation of loader 102 and unloader 103 arranged on both sides of the above-mentioned guide rails 117 and 118. However, since loader 102 and unloader 103 are constitutions that are completely symmetrical, a detailed description is only provided for loader 102 to avoid making the drawings and so forth excessively complicated.

As shown in FIG. 4, loader 102 has elevator mechanism base 131, and an elevator mechanism not shown is provided on said elevator mechanism base 131. Said elevator mechanism raises or lowers magazine M at increments of the arrangement pitch of lead frames L/F to push out one lead frame L/F at a time from the large number of lead frames L/F arranged and contained in said magazine M by the operation of pushing mechanism 113.

A pair of linear regulating members 133 and 134 are provided on elevator mechanism base 131 so as to be arranged in a row roughly in a straight line in the direction of lead frame guiding with respect to both of the above-mentioned guide rails 117 and 118. Both these regulating members 133 and 134 are for regulating magazine M in the direction of width by engaging with both the left and right sides of said magazine M. As shown in arrows F and G, said regulating members 133 and 134 are able to freely and relatively approach and move away from each other, and the gap between the two can be adjusted as desired. Regulating member driving devices 135 and 136 are provided which move both said regulating members 133 and 134, respectively. Both regulating members 133 and 134 are made to approach or move away from magazine M by the operation of both said regulating member driving devices 135 and 136. These regulating member driving devices 135 and 136 are composed of pulse motors 135a and 136a fixed on elevator mechanism base 131, males screws 135b and 136b rotated and driven by being coupled to the output shaft of each of said pulse motors, and nuts (not shown) fastened to both regulating members 133 and 134 which screw onto each of said male screws 135b and 136b, respectively.

Two different regulating members 138 and 139 are provided to the front and back of the above-mentioned regulating members 133 and 134. These regulating members 138 and 139 are for regulating magazine M in the lengthwise direction by engaging with the front and back ends of said magazine M. One of these regulating members, regulating member 138, is fastened to the rear end of regulating member 133, while the other regulating member, regulating member 139, is attached to the front end of regulating member 133 and is able to freely approach and move away from this regulating member 138 as shown with arrow H. Regulating member driving device 141 is provided on regulating member 133 for moving this regulating member 139. Said regulating member driving device 141 is composed of pulse motor 141a fixed on regulating member 133, male screw 141b rotated and driven by being coupled to the output shaft of said pulse motor 141a, and a nut (not shown) fastened to regulating member 139 which screws onto said male screw 141b.

As shown in the drawing, sensors 143 and 144 are respectively provided on the above-mentioned regulating members 134 and 139. These sensors 143 and 144 are for detecting that each of regulating members 133 and 134 along with 138 and 139 have regulated the position of magazine M. Said sensors 143 and 144 are collectively referred to as a second detection device.

Furthermore, these sensors 143 and 144 are composed of reflecting optical sensors in the same manner as each of previously described sensors 125 to 129. Said sensors 143 and 144 are attached to each regulating member 134 and 139 in a state similar to that of sensors 128 and 129 shown in FIG. 5.

Figure 6:
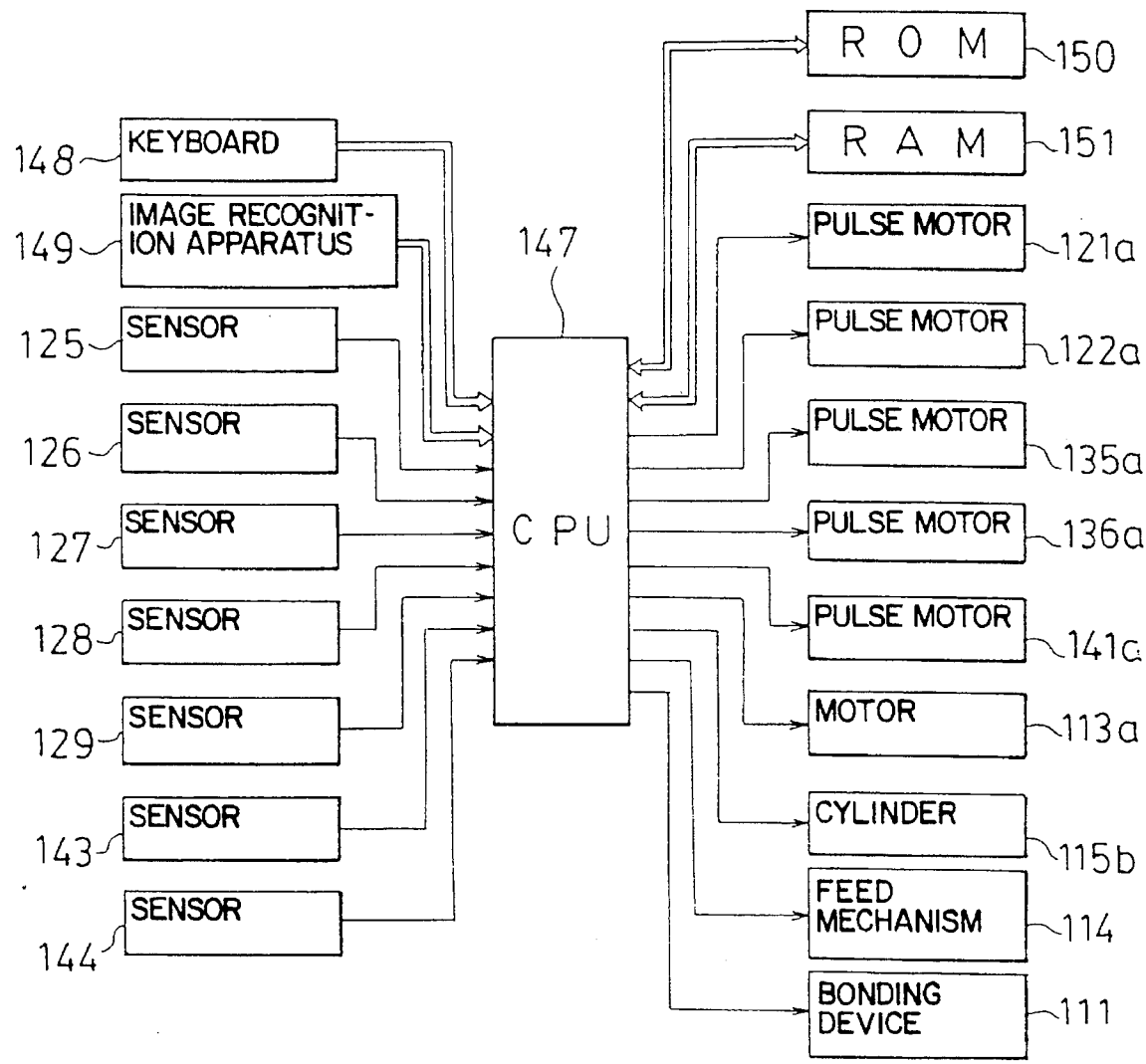
FIG. 6 is a block diagram showing the operational control system of the apparatus shown in FIG. 4.

As shown in FIG. 6, the detection signals emitted by each of the above-mentioned sensors 125 to 129, 143 and 144 are sent to a controller (referred to as a CPU) 147 which governs operational control of said wire bonding apparatus. Said CPU 147 receives these signals along with signals transmitted by keyboard 148 and image recognition apparatus 149 (also shown in FIG. 5) and operates each pulse motor 121a, 122a, 135a, 136a, 141a, motor 113a, cylinder 115b, feed mechanism 114 and bonding device 111 with the timing as subsequently described.

Figure 7:
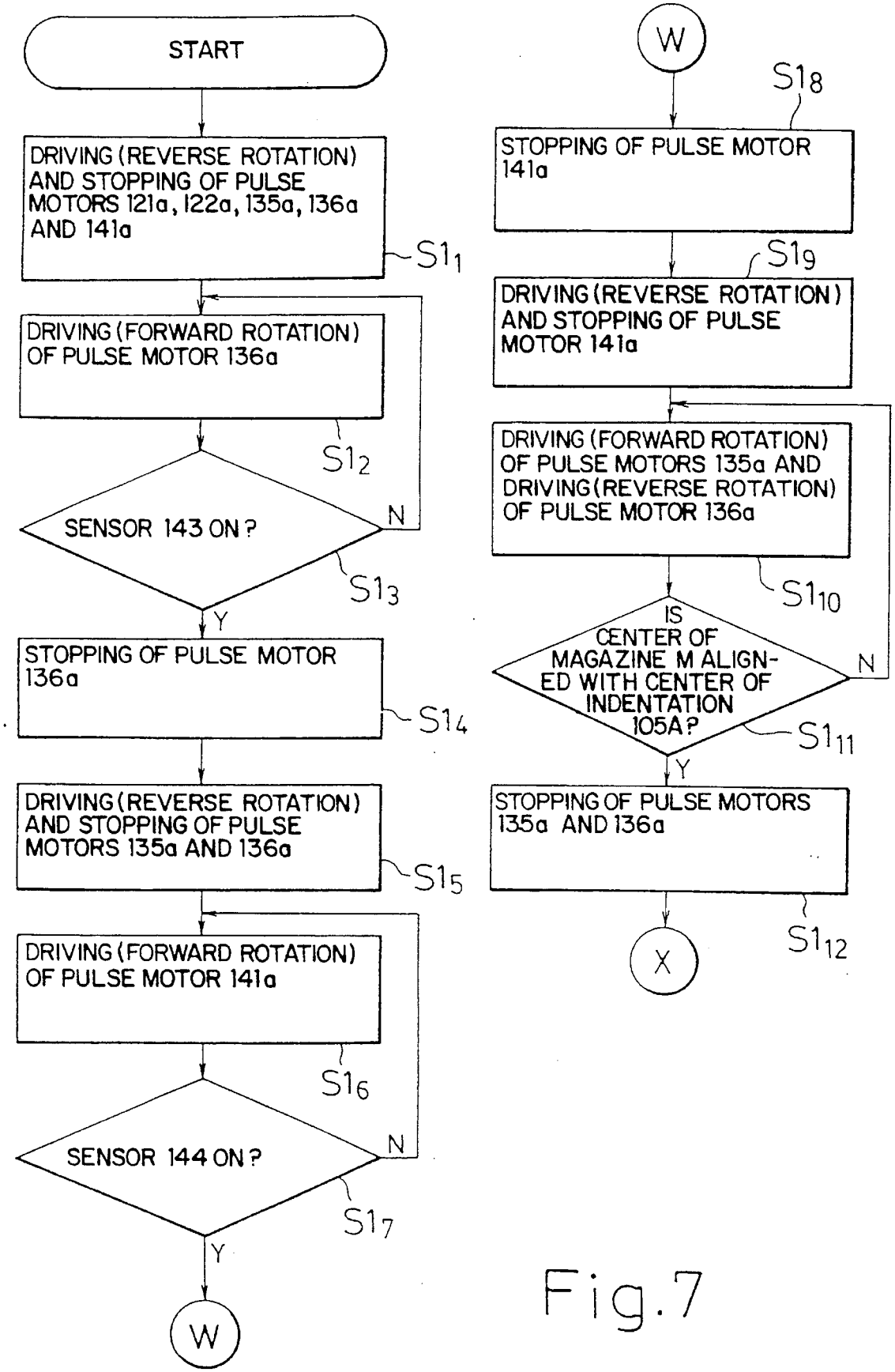
FIG. 7 is a flow chart representing the operation of the apparatus shown in FIG. 4.
Figure 8:
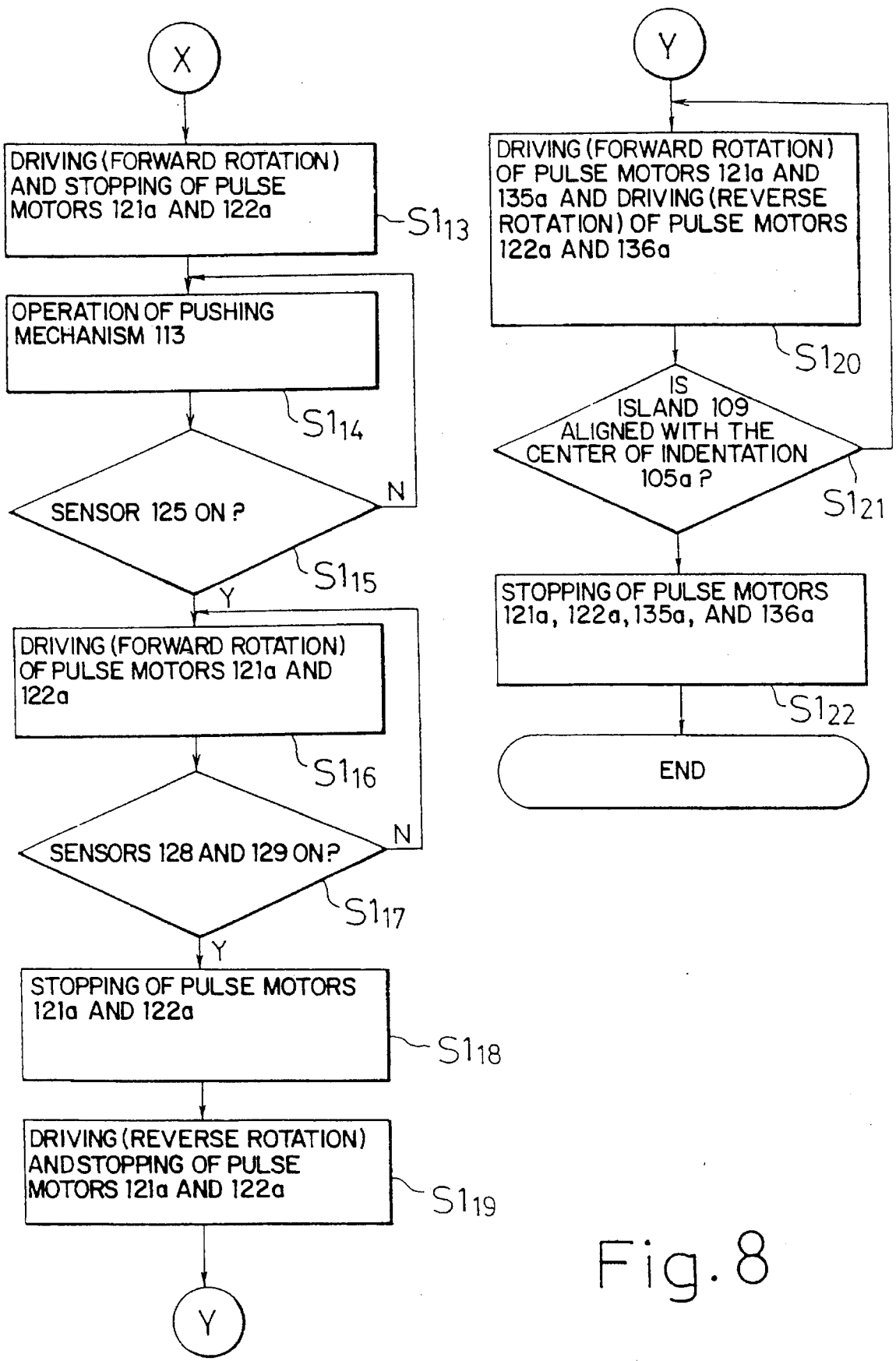
FIG. 8 is a flow chart representing the operation of the apparatus shown in FIG. 4.

Next, the following provides an explanation of operation in the case of changing the type of lead frame L/F handled in the wire bonding apparatus having the above-mentioned constitution while referring to FIGS. 7 through 19. In this case, the above-mentioned CPU 147 (see FIG. 6) reads work procedural data input in advance to ROM (Read Only Memory) 150, and then controls operation following the flow chart shown in FIGS. 7 and 8 based on that data. In addition, data is input to and stored in RAM (Random Access Memory) 151 as subsequently described. Furthermore, FIGS. 7 and 8 show a single flow chart divided into two sections. In addition, as was previously described, since loader 102 and unloader 103 have mutually similar constitutions and operate in the same manner, an explanation is provided only for loader 102.

To begin with, when a command signal is emitted by operation of keyboard 148 (see FIG. 6) and so forth, CPU 147 rotates each pulse motor 121a, 122a, 135a and 136a in reverse as shown in FIG. 4 to move both regulating members 133 and 134 as well as both guide rails 117 and 118 in the direction in which they move away from each other to position them at their respective reference positions (shown as Step $S1_1$ in FIG. 7).

While in this state, a magazine M containing lead frames to be newly handled by said apparatus is loaded between both regulating members 133 and 134.

Figure 9:
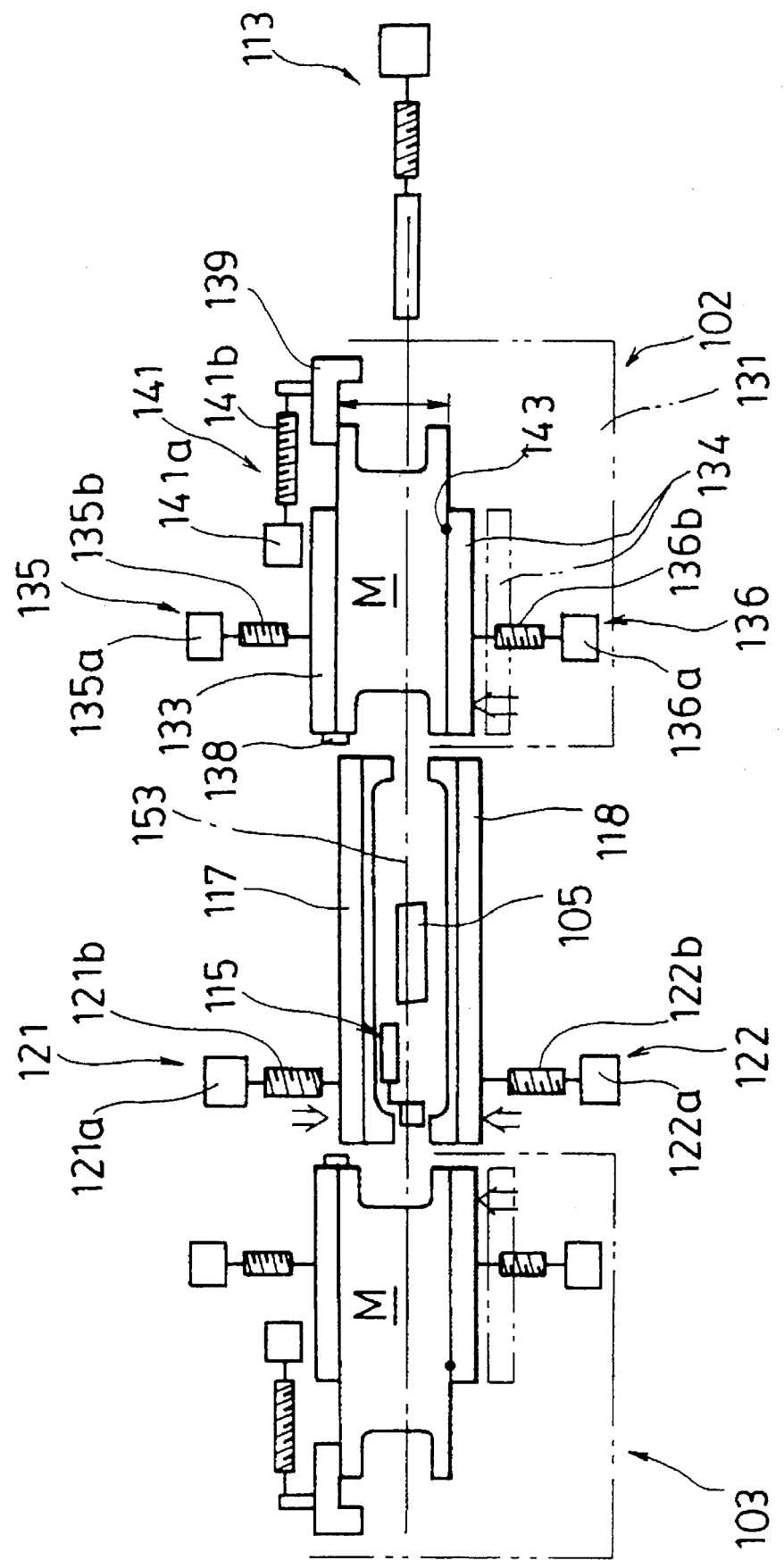
FIG. 9 is a schematic diagram of the operation of the apparatus shown in FIGS. 4 and 5.

Continuing, pulse motor 136a for driving regulating member 134 is rotated in the forward direction and said regulating member 134 is moved towards the other regulating member 133 as shown in FIG. 9. Said pulse motor 136a is stopped based on a detection signal emitted by sensor 143 when magazine M, pushed to the side of regulating member 133 by said regulating member 134, is detected by said sensor 143 (Steps $S1_2$ to $S1_4$). As a result, magazine M is pinched from both sides by both regulating members 133 and 134.

After the above procedure, each pulse motor 135a and 136a is slightly rotated in reverse (Step $S1_5$). As a result, the optimum gap (not shown) is provided between both the above-mentioned regulating members 133 and 134 and the side surfaces of magazine M.

Figure 10:
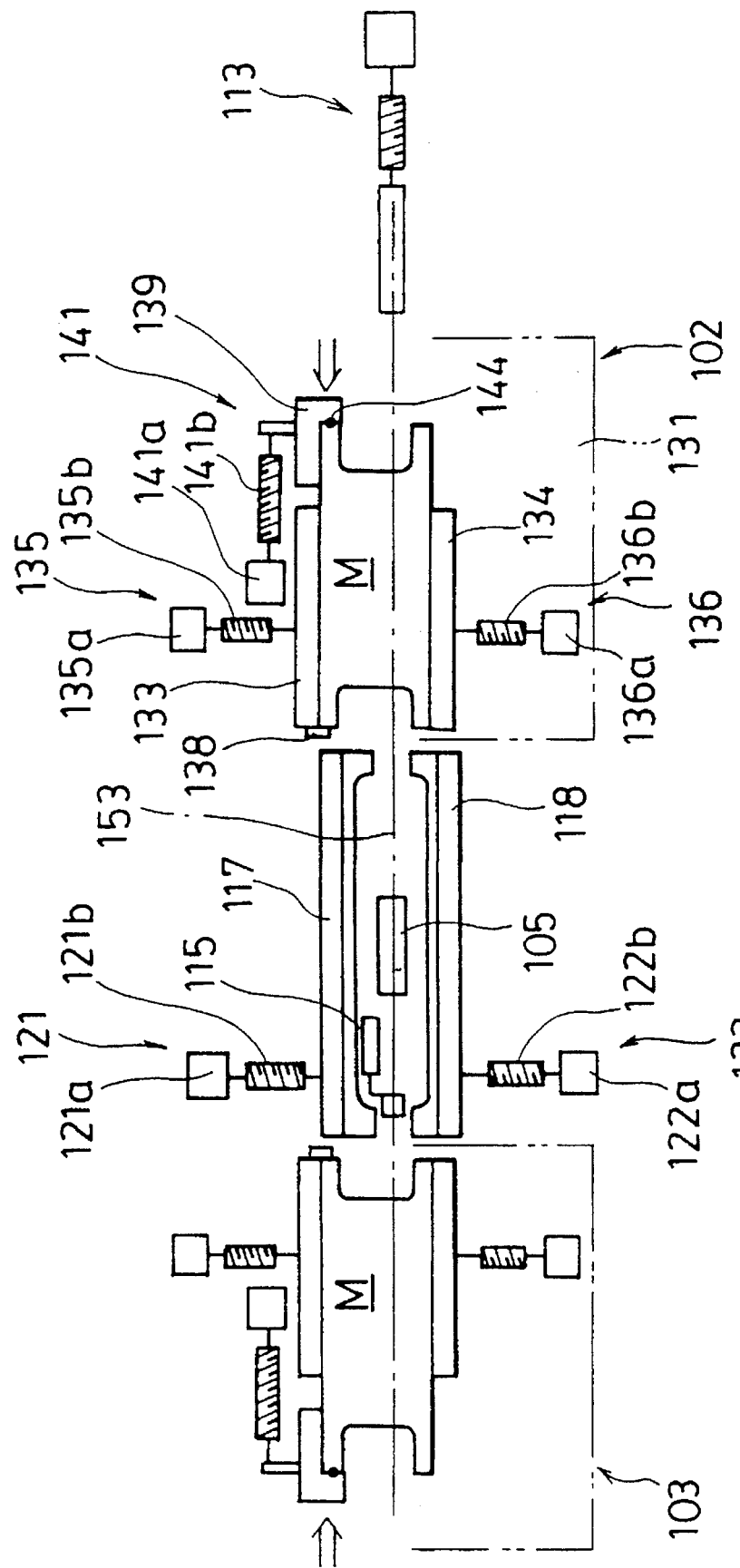
FIG. 10 is a schematic diagram of the operation of the apparatus shown in FIGS. 4 and 5.

Next, pulse motor 141a is rotated in the forward direction and regulating member 139 is moved towards the other regulating member 138 as shown in FIG. 10. Said pulse motor 141a is stopped based on a detection signal emitted by sensor 144 when magazine M, pushed to the side of regulating member 138 by said regulating member 139, is detected by said sensor 144 (Steps $S1_6$ to $S1_8$).

The above-mentioned pulse motor 141a is then slightly rotated in reverse (Step $S1_9$). As a result, the optimum gap (not shown) is provided between both the above-mentioned regulating members 138 and 139 and the ends of magazine M. Thus, magazine M is able to move freely in the vertical direction (direction perpendicular to the paper in the drawing) while being surrounded by each regulating member 133, 134, 138 and 139, thus enabling magazine M to be raised and lowered by an elevator mechanism not shown.

Figure 11:
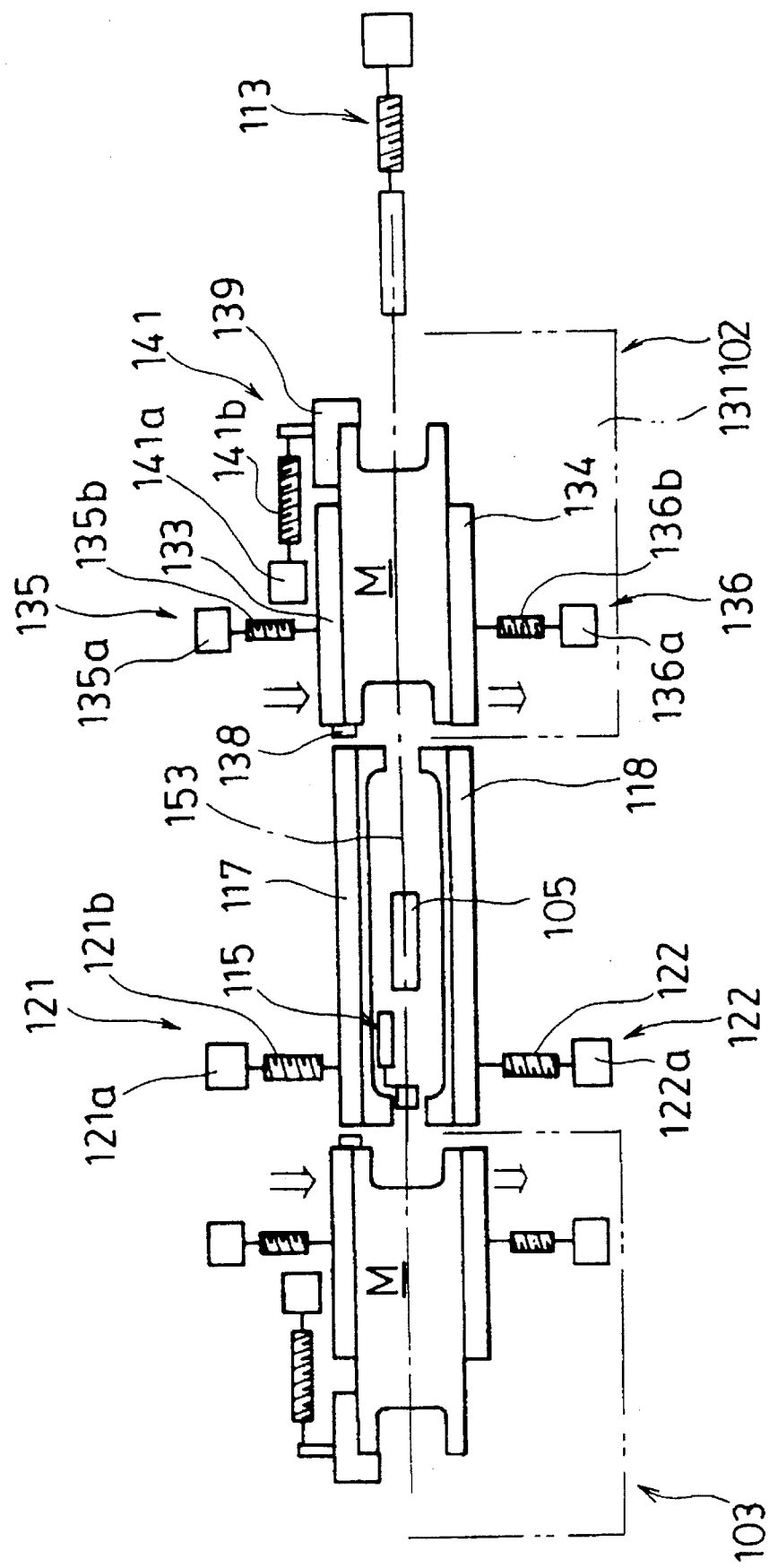
FIG. 11 is a schematic diagram of the operation of the apparatus shown in FIGS. 4 and 5.

Next, pulse motor 135a is rotated in the forward direction and the other pulse motor 136a is rotated in reverse (Step $S1_{10}$). Both regulating members 133 and 134 are then moved in synchronization at the same resolution, at the same speed and in the same direction as shown in FIG. 11. Said pulse motors 135a and 136a are then stopped when the center of magazine M is aligned in the direction of width with center 153 of the prescribed path over which lead frames L/F are to be guided (Steps $S1_{11}$ to $S1_{12}$). In this case, center 153 of the above-mentioned prescribed path refers to the center of indentation 105a formed in heater plate 105.

Furthermore, when both regulating members 133 and 134 are moved in the same direction so as to align the center in the direction of width of magazine M with center 153 of the prescribed path as described above, the amount of movement of both said regulating members 133 and 134 is set to W/2 if the amount of movement from the reference position to the stopping position of only regulating member 134 performed in the previous step is taken to be W.

When the positioning operation of magazine M described above has been completed, or in parallel with said magazine positioning operation, pulse motors 121a and 122a for driving guide rails 117 and 118, respectively, are each rotated in the forward direction by a prescribed amount of rotation, thus moving guide rails 117 and 118 from the state shown in FIG. 4 to the state shown in FIGS. 9 through 11, namely to the state in which they have approached the above-mentioned center 153 (Step $S1_{13}$). In this state, the gap between receiving surfaces 117b and 118b (see FIG. 5) possessed by both guide rails 117 and 118 is set to be slightly larger than the dimension of width of lead frames L/F contained in magazine M (to be subsequently described). However, receiving surfaces 117a and 118a perpendicular to these receiving surfaces 117b and 118b for holding the back portion of lead frame L/F are in a state in which they are able to hold said lead frame L/F.

Figure 12:
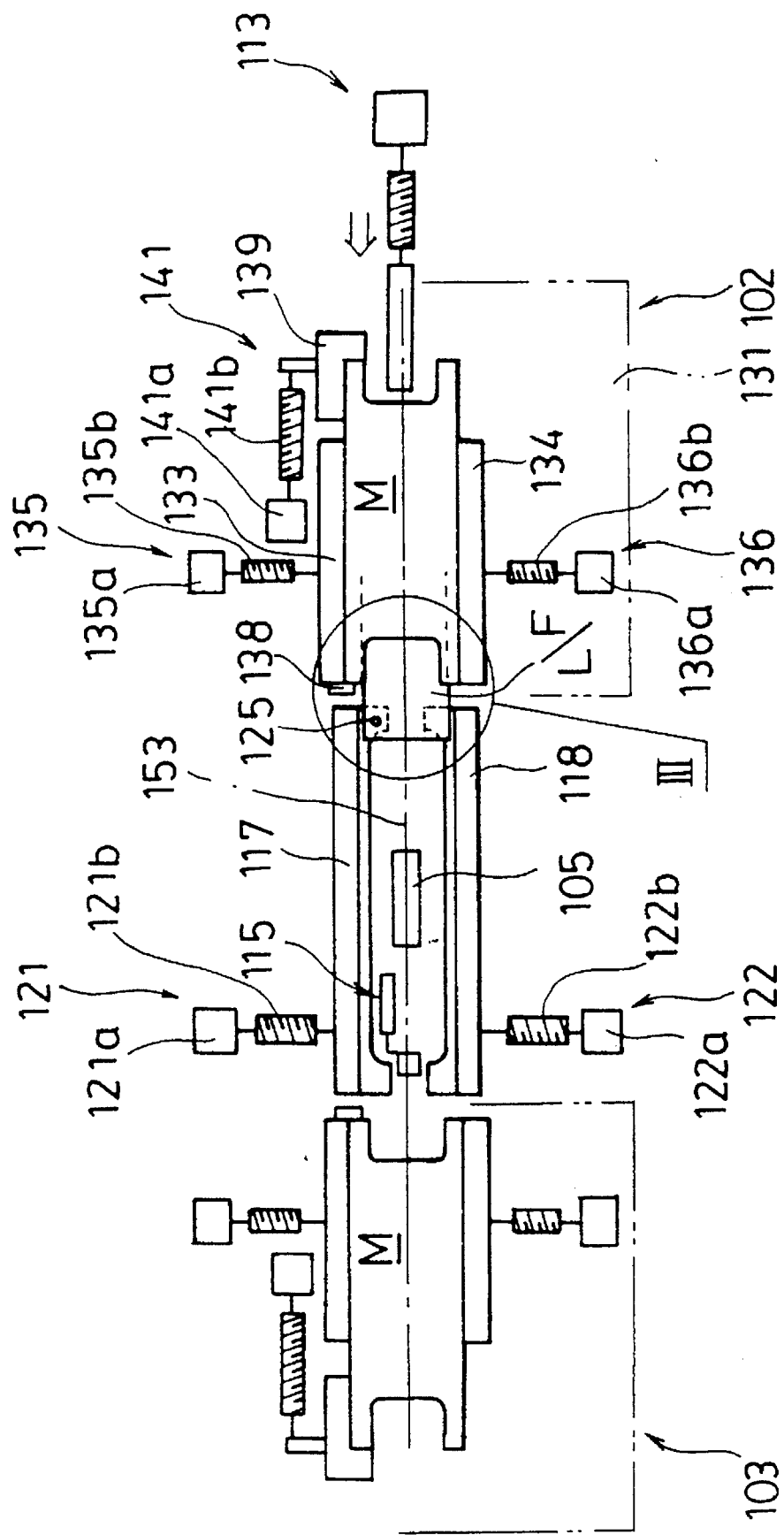
FIG. 12 is a schematic diagram of the operation of the apparatus shown in FIGS. 4 and 5.

Continuing, pushing mechanism 113 is operated and an arbitrary lead frame L/F contained from the lowermost level to the uppermost level in magazine M is pushed outside said magazine M as shown in FIG. 12, and its leading end is placed on receiving surfaces 117a and 118a of both guide rails 117 and 118 where it is also detected by sensor 125 (Steps $S1_4$ and $S1_{15}$). Furthermore, as is clear from FIG. 13, gap K is formed between each receiving surface 117a and 118a of both guide rails 117 and 118 and both side ends of lead frame L/F in this state.

Figure 14:
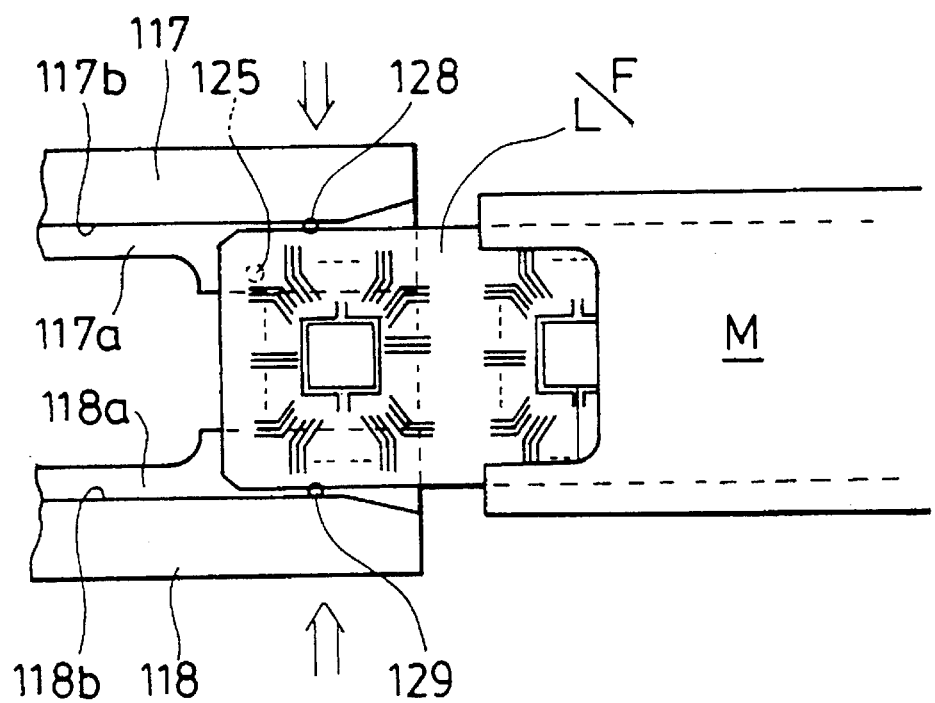
FIG. 14 is a schematic diagram of the operation of the apparatus shown in FIGS. 4 and 5.

Pulse motors 121a and 122a are both rotated in the forward direction based on the detection signal emitted by the above-mentioned sensor 125 (Step $S1_{16}$), and both guide rails 117 and 118 are made to approach lead frame L/F as shown in FIG. 14. Said pulse motors 121a and 122a are then stopped based on detection signals emitted by sensors 128 and 129 when lead frame L/F is detected by said sensors 128 and 129 (Steps $S1_{17}$ and $S1_{18}$). As a result, lead frame L/F is pinched from both sides by receiving surfaces 117b and 118b of both guide rails 117 and 118.

Figure 15:
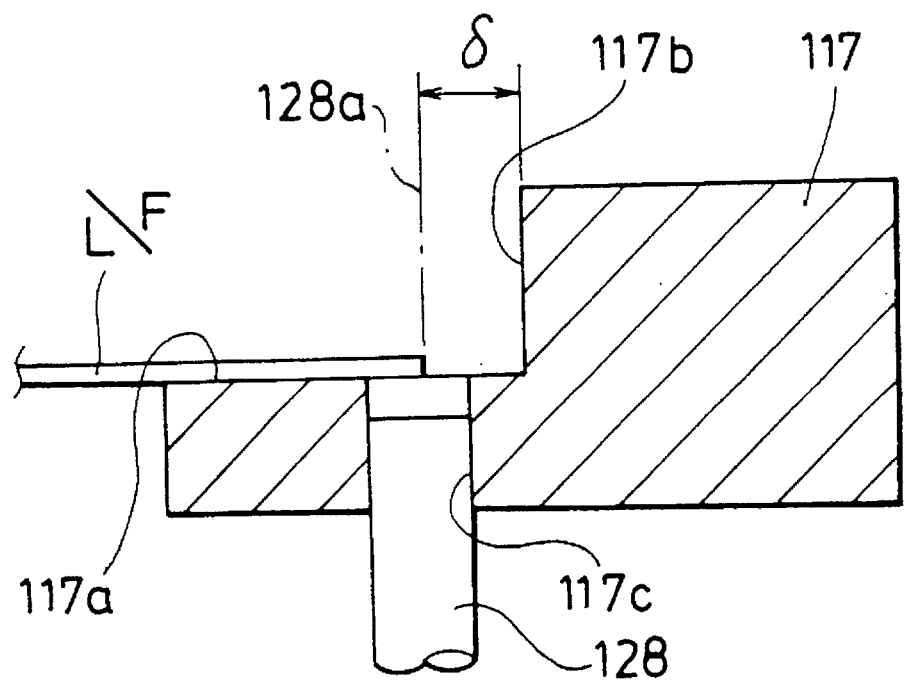
FIG. 15 is a longitudinal cross-sectional view showing a variation of a portion of the apparatus shown in FIGS. 4 and 5.

Following this procedure, each of the above-mentioned pulse motors 121a and 122a are slightly rotated in reverse (Step $S1_{19}$). As a result, the optimum gap δ is provided between vertical receiving surfaces 117b and 118b equipped on both the above-mentioned guide rails 117 and 118 and both side edges of lead frame L/F as shown in FIG. 5, thus enabling transport of lead frame L/F. Furthermore, as shown in FIG. 15, if, for example, sensor 128 is installed so that optical axis 128a of its irradiated light at the position of the above-mentioned δ from receiving surface 117b of guide rail 117, and the side edge of lead frame L/F is detected by this, the above-mentioned guide rail return operation for providing gap δ is not necessary. This applies similarly to sensor 129 provided on the other guide rail 118. In addition, this also applies similarly to the other sensors 143 and 144 provided on regulating members 134 and 139 for detection of magazine M.

Figure 13:
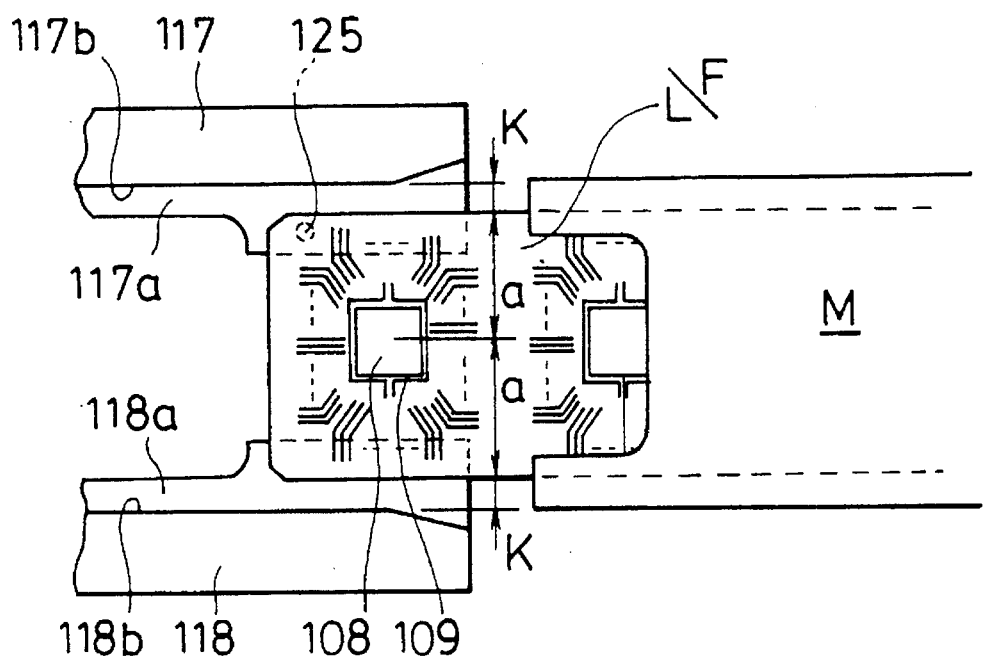
FIG. 13 is an enlarged view of section III in FIG. 12.

As a result of the series of operations described above, lead frame L/F to be newly handled as well as the center in the direction of width of magazine M which contains said lead frame L/F are aligned with center 153 of the prescribed path over which lead frame L/F is to be guided, namely the center of indentation 105a of heater plate 105. Furthermore, as shown in FIGS. 5 and 13, in the case the center of island 109 of lead frame L/F is aligned with the center in the direction of width of said lead frame L/F, the center of this island 109 aligns with center 153 of the above-mentioned prescribed path.

Figure 16:
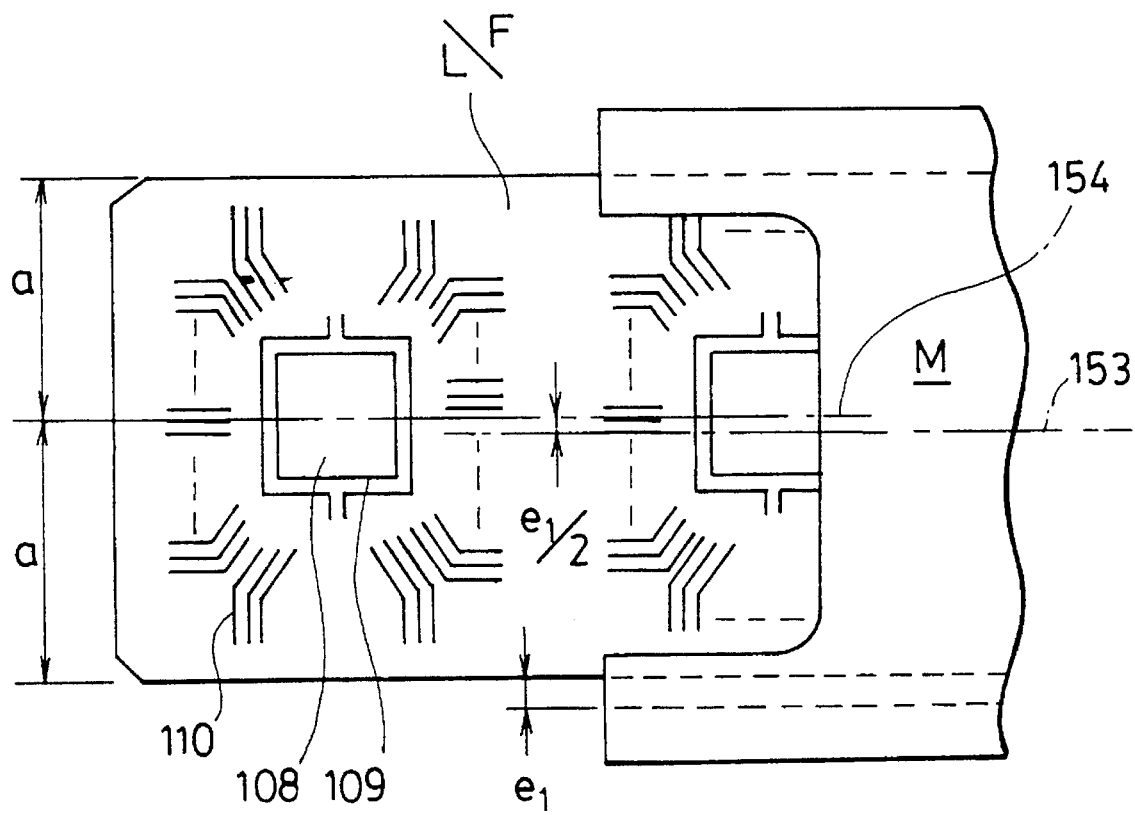
FIG. 16 is a schematic diagram of the operation of the apparatus shown in FIGS. 4 and 5.
Figure 17:
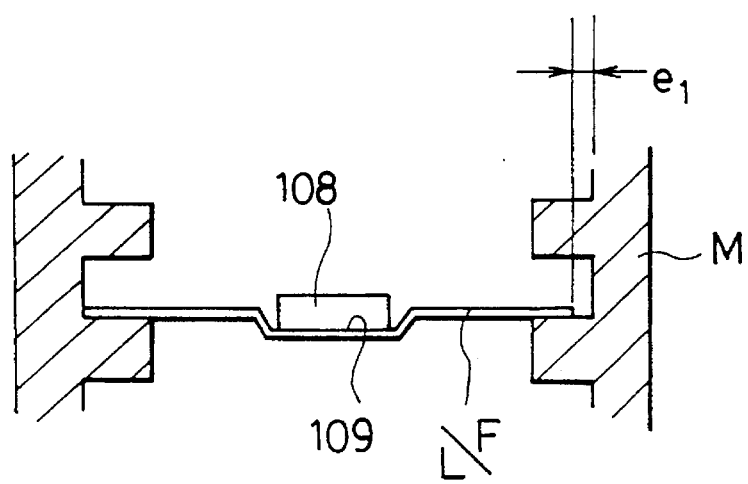
FIG. 17 is a schematic diagram of the operation of the apparatus shown in FIGS. 4 and 5.
Figure 18:
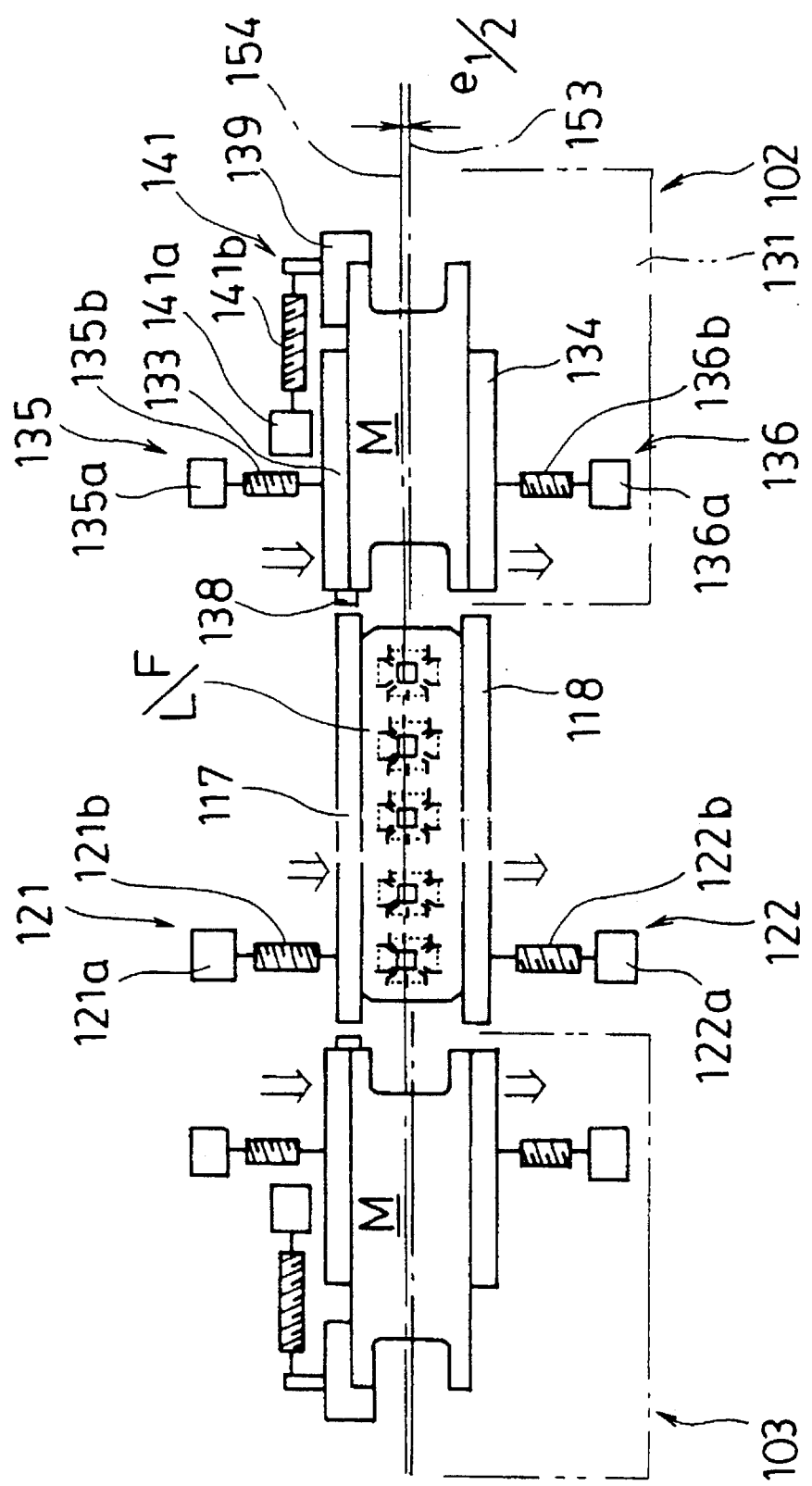
FIG. 18 is a schematic diagram of the operation of the apparatus shown in FIGS. 4 and 5.

However, as shown in FIGS. 16 and 17, maximum gap $e_1$ is formed between the side edge of lead frame L/F and the inner wall surface of magazine M to enable lead frame L/F to be pushed out and contained smoothly with respect to magazine M. Accordingly, in the case lead frame L/F is contained in magazine M biased to one side of said magazine M as shown in the drawings, even if the center in the direction of width of magazine M described above is aligned with center 153 of the prescribed path, center 154 of island 109 provided on said lead frame L/F (shown in FIGS. 16 and 18) is not aligned as a result of being displaced by an amount of $e_1/2$ with respect to center 153 of said prescribed path. In this case, operation continues through that described above followed by the operation subsequently described in order to correct this displacement.

Furthermore, the explanation thus far has been premised on each lead frame L/F being in a state within magazine M wherein the above-mentioned displacement does not occur. In the case each lead frame L/F is displaced to one side in magazine M as described above, since there is the risk of the pushing out and containment operation of lead frame L/F lacking smoothness due to the side edge of lead frame L/F making contact with the inner wall surface of magazine M, correction is performed so that each lead frame L/F is positioned in the center of magazine M. This correction operation is shown in the flow chart of FIGS. 7 and 8. More specifically, said correction operation is performed by slightly rotating pulse motors 135a and 136a in synchronization to move both regulating members 133 and 134 in the same direction, thereby moving magazine M in the direction in which displacement is corrected.

In order to correct this amount of displacement $e_1/2$ between center 154 of island 109 and center 153 of the prescribed path, while pulse motors 121a and 135a are rotated in the forward direction, other pulse motors 122a and 136a are rotated in reverse. As a result, each regulating member 133 and 134 along with both guide rails 117 and 118 are moved in synchronization in the same direction, at the same resolution and at the same speed, and stopped when the center in the direction of width of magazine M is shifted by the above-mentioned amount of displacement $e_1/2$ with respect to the center of the prescribed path, namely when the above-mentioned center 154 of island 109 aligns with center 153 of the prescribed path (Steps $S1_{20}$ to $S1_{22}$).

Figure 19:
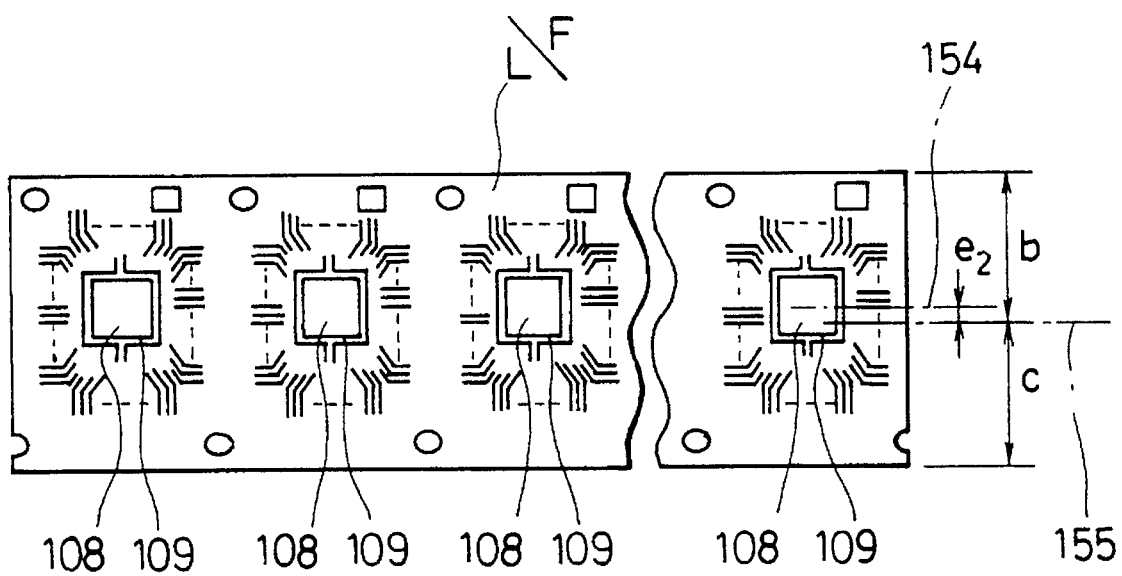
FIG. 19 is an overhead view of another example of a lead frame to be handled in the apparatus shown in FIGS. 4 and 5.

Furthermore, as shown in FIG. 19, there are also lead frames L/F which are formed in which center 154 of island 109 is displaced by an amount $e_2$ with respect to center 155 in the direction of width of said lead frames. In this case as well, a displacement correction operation is performed in the same manner as described above so that center 154 of this island 109 is aligned with center 153 of the prescribed path.

Furthermore, in addition to confirmation that center 154 of island 109 is aligned with center 153 of the above-mentioned prescribed path, namely the center of indentation 105a of heater plate 105, being performed by an image signal obtained from image recognition apparatus 149 (see FIGS. 5 and 6) being sent to CPU 147 (shown in FIG. 6), it is also performed by the operator himself visually monitoring a microscope (not shown) arranged at a position above heater plate 105 or a monitor television (not shown) connected to said image recognition apparatus 149.

Thus, adjustment of the transport path corresponding to the lead frames L/F to be handled by the apparatus is completed.

When the positions of magazine M and lead frames L/F have been set in the manner described above, CPU 147 (see FIG. 6) inputs and stores those set positions, more specifically, the set positions of each regulating member 133 and 134 as well as 139 along with both guide rails 117 and 118, in RAM 151. When the same type of lead frame L/F is handled by the apparatus again, CPU 147 recalls this stored data and immediately performs position setting.

When adjustment in the direction of frame width as described above is completed, setting of feeding of lead frames L/F in the direction following the above-mentioned prescribed path is performed according to the procedure described below.

To begin with, feed mechanism 114 (see FIG. 4) is operated which results in lead frame L/F being fed a minute distance at a time. While in this state, adjustment is performed in the same manner as during the above-mentioned adjustment in the direction of frame width by CPU 147 or by the operator using image recognition apparatus 149 while confirming the resulting image. Furthermore, crosshairs are simultaneously shown to serve as a reference within the resulting image.

The leading edge of the first lead frame L/F fed is confirmed to have reached the intersection of the above-mentioned crosshairs, and this coordinate position is stored in RAM 151 as a first reference.

Next, the center of the first island 109 from the leading edge of lead frame L/F is confirmed to have reached the intersection of the crosshairs, and this coordinate position is stored in RAM 151 as a second reference.

Then, after confirming that the center of the second island 109 from the leading edge has reached the intersection of the crosshairs, the amount of feeding of lead frame L/F from the above-mentioned second reference to this point is computed and stored in RAM 151. This determined amount of feeding corresponds to the pitch between neighboring islands 109. Furthermore, this amount of feeding is determined by monitoring the amount of operation of the above-mentioned feed mechanism 114 by an encoder and so forth not shown. In addition, aside from immediately determining the pitch by computing the amount of feeding from the first island 109 to the second island 109 as described above, the lead frames may be fed all at once until the center of the Nth island starting with the third island aligns with the crosshairs, and the mean pitch may then be determined as the value resulting from dividing the amount of feeding from the first island until the Nth island is reached, namely the distance between centers of said islands, by N-1.

After performing the above-mentioned operation, lead frame L/F is fed until the rear end of said lead frame L/F reaches the intersection of the crosshairs. The total amount of feeding until this point from the above-mentioned first reference is then stored in RAM 151. This total amount of feeding is the total length of lead frame L/F.

Each of the measured values stored in RAM 151 in the above manner are reproduced by recalling this stored information as necessary.

Furthermore, although the reference positions during operation of each regulating member 133 and 134 along with both guide rails 117 and 118 are set at the movement limit positions or their vicinity in the direction in which regulating members 133 and 134 as well as both guide Fails 117 and 118 move away from each other in the present embodiment, said reference positions can also be set at arbitrary positions. For example, if there is a lead frame that has been transported before the lead frame to be newly handled by the apparatus, the position that coincides with this prior lead frame and the magazine which contains it may be used as the reference position, thereby enabling the position which coincides with a new lead frame and magazine to be computed based on this original reference position.

In addition, adjustment of the transport path can also be performed by following the positions of the guide Fails and so forth according to the images and so forth obtained from image recognition apparatus 149 without setting reference positions as described above.

In addition, although the adjustment operation is performed in the present embodiment by making one of the regulating members, regulating member 133, stationary and moving only the other regulating member, regulating member 134, prior to moving both regulating members 133 and 134 in the same direction to align the center in the direction of width of magazine M with center 153 of the prescribed path, conversely, said regulating member 134 may be made to be stationary while moving regulating member 133, or both regulating members 133 and 134 may be operated together.

Moreover, although sensors 128 and 129, for detecting that guide rails 117 and 118 have reached the state where they are able to guide lead frame L/F by engaging with said lead frame L/F, and sensors 143 and 144, for detecting that each regulating member 133, 134, 138 and 139 has regulated the position of magazine M, are provided in the present embodiment, each of these sensors is not required if this detection is performed by using image recognition apparatus 149 and so forth.

In addition, if signal generation devices 121c, 122c, 135c, 136c and 141c in the form of encoders which emit pulse signals corresponding to the amount of operation, namely the angle of rotation, of each of pulse motors 121a, 122a, 135a, 136a and 141a possessed by guide member driving devices 121 and 122 along with regulating member driving devices 135, 136 and 141, respectively, for moving each of the above-mentioned guide rails 117 and 118 as well as each regulating member 133, 134 and 139, are equipped, each of the above-mentioned sensors 128, 129, 143 and 144 can be eliminated.

Namely, since both guide rails 117 and 118 along with each regulating member 133, 134, 138 and 139 are unable to be moved further once they have engaged with each lead frame L/F and magazine M and pinched them from both sides, pulse signals can no longer be obtained from the above-mentioned encoders. Thus, the pulse motors are stopped by detecting this state. Furthermore, in consideration of each pulse motor continuing to rotate excessively for several pulses due to its inertia at this time, it is preferable to rotate each pulse motor in reverse by the same number of excess pulses after stopping.

In addition, in the case it becomes necessary to replace heater plate 105 when handling a certain type of lead frames L/F, and indentation 105a of said heater plate 105 ends being displaced from island 109 of lead frame L/F as a result of performing that replacement, since it is only necessary to perform an operation which aligns island 109 with indentation 105a by moving both regulating members 133 and 134 along with both guide rails 117 and 118 in the same direction, adjustment can be performed extremely quickly and easily.

In addition, although the adjustment of the transport path of lead frames in a wire bonding apparatus is indicated in the present embodiment, it goes without saying that the present invention can also be applied to other apparatuses, substrates and substrate containment devices.

Figure 20:
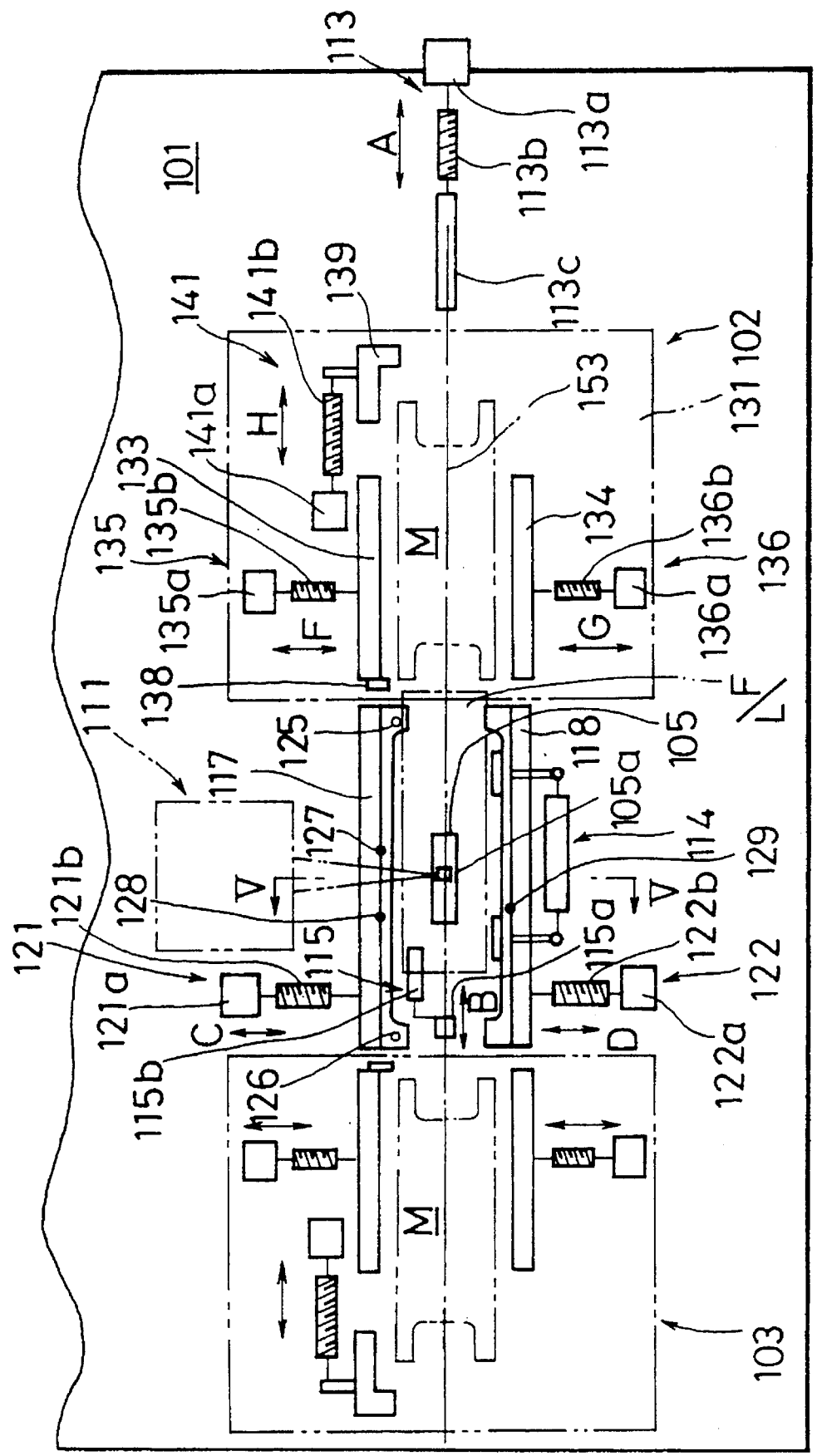
FIG. 20 is an overhead view of the essential portion of a wire bonding apparatus containing a substrate transport apparatus as a second embodiment of the present invention.
Figure 21:
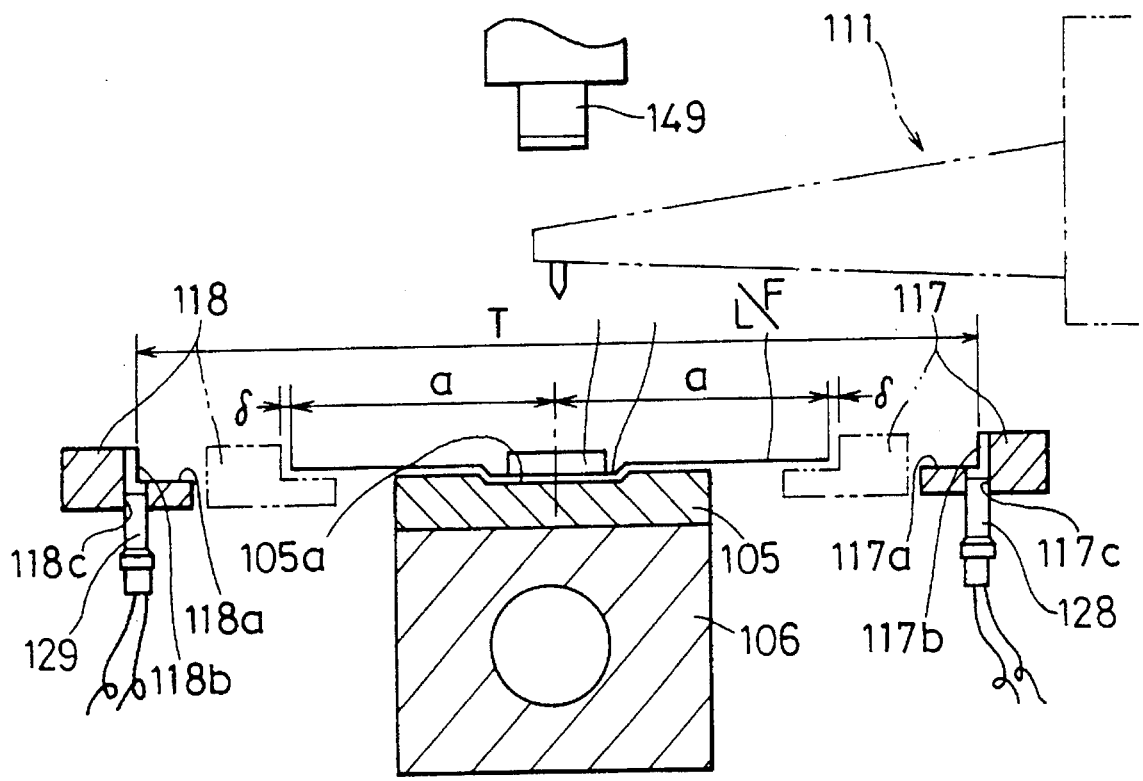
FIG. 21 is a view taken along arrows V—V relating to FIG. 20.

Next, the following provides an explanation of a wire bonding apparatus equipped with a substrate transfer apparatus as a second embodiment of the present invention while referring to FIGS. 20 and 21. Furthermore, since said wire bonding apparatus is similarly composed to the wire bonding apparatus as a first embodiment of the present invention shown in FIGS. 1 through 19 with the exception of those portions described below, an explanation of the entire apparatus is omitted, with the explanation only focusing on the essential portion. In addition, the same reference numerals are used for those constituent members identical to the constituent members of the wire bonding apparatus shown in FIGS. 1 through 19.

Said wire bonding apparatus is equipped with pulse motors 135a, 136a and 141a, and encoders (not shown) that emit pulse signals corresponding to the respective angles of rotation of each of said pulse motors. These encoders act as a second detection device for detecting that each regulating member 133, 134 and 139 has reached the position where it is able to regulate the position of magazine M. Furthermore, as previously described, sensors 128 and 129 act as a first detection device for detecting that both guide rails 117 and 118 have engaged with lead frame L/F and reached a state of being able to guide said lead frame L/F.

Figure 22:
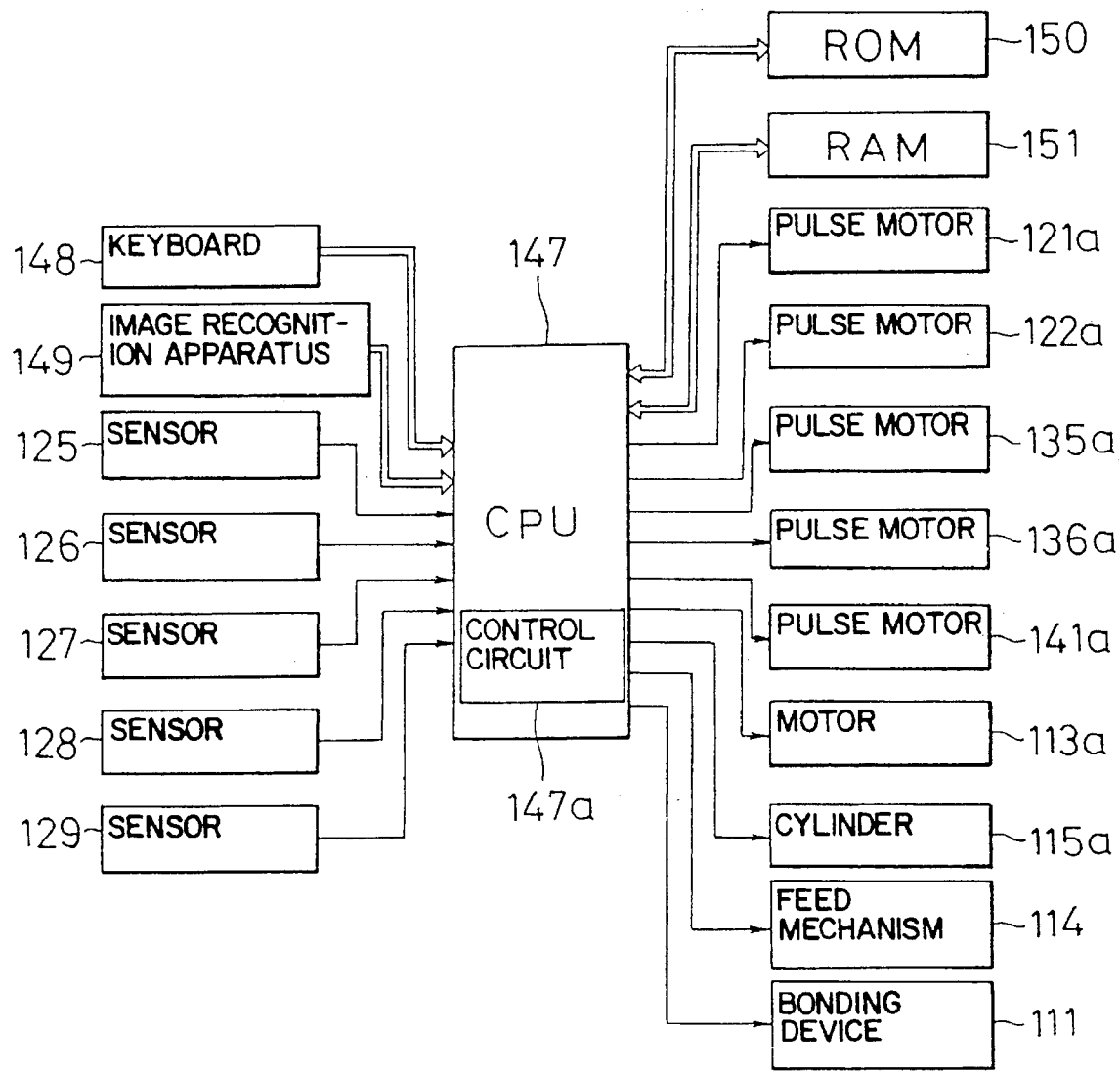
FIG. 22 is a block diagram showing the operational control system of the apparatus shown in FIG. 20.

As shown in FIG. 22, detection signals emitted by sensors 125 to 129 are sent to a controller (referred to as a CPU) 147 which governs operational control of said wire bonding apparatus. Said CPU 147 receives these signals along with signals transmitted by keyboard 148 and image recognition apparatus 149 (also shown in FIG. 21) and operates each pulse motor 121a, 122a, 135a, 136a, 141a, motor 113a, cylinder 115b, feed mechanism 114 and bonding device 111 with the timing as subsequently described.

Figure 23:
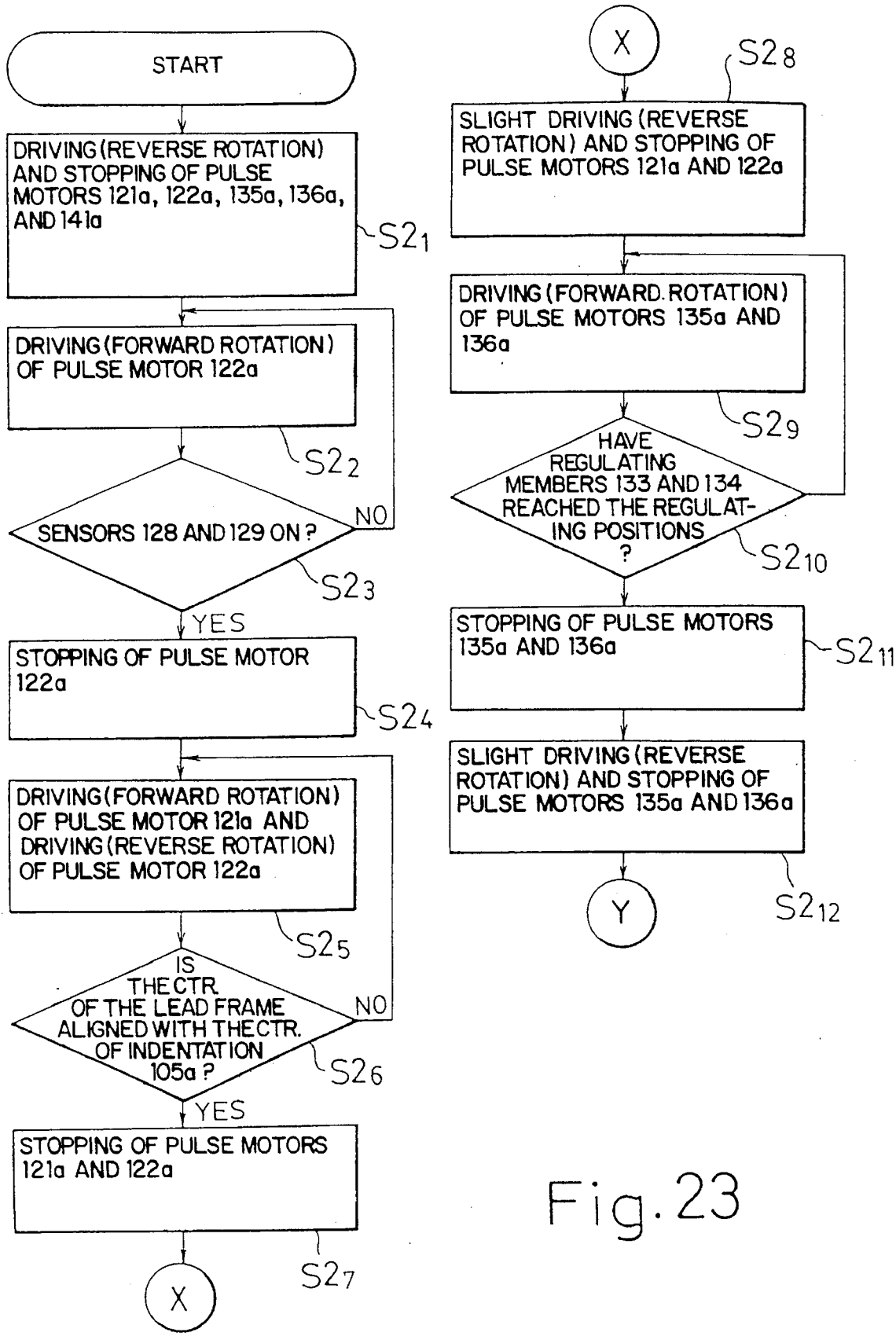
FIG. 23 is a flow chart representing the operation of the apparatus shown in FIG. 20.
Figure 24:
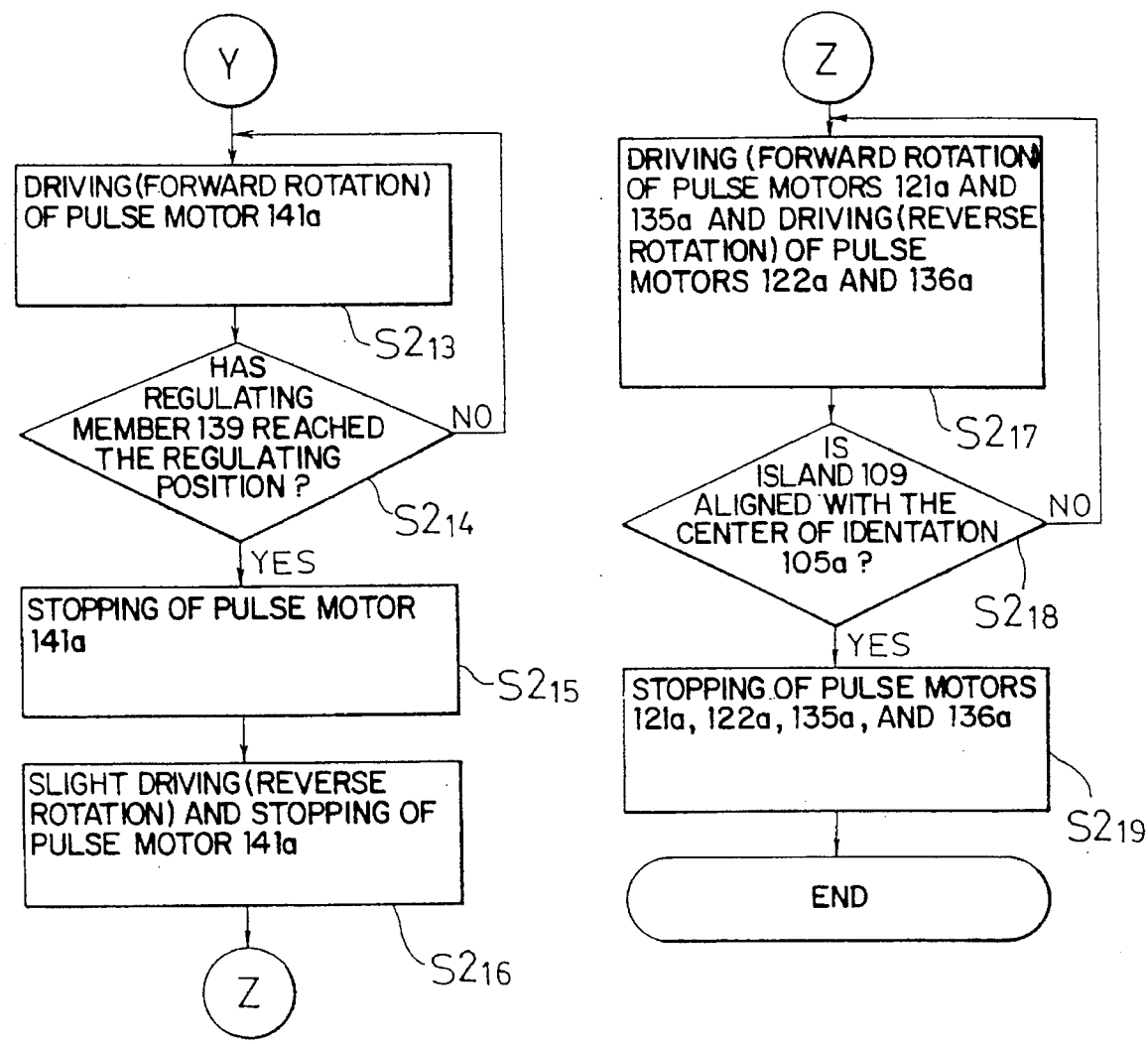
FIG. 24 is a flow chart representing the operation of the apparatus shown in FIG. 20.

Next, the following provides an explanation of operation in the case of changing the type of lead frame L/F handled in the wire bonding apparatus having the above-mentioned constitution while referring to FIGS. 23 through 33. In this case, the above-mentioned CPU 147 (see FIG. 22) reads work procedural data input in advance to ROM (Read Only Memory) 150, and then controls operation following the flow chart shown in FIGS. 23 and 24 based on that data. In addition, data is input to and stored in RAM (Random Access Memory) 151 as subsequently described. Furthermore, FIGS. 23 and 24 show a single flow chart divided into two sections. In addition, as was previously described, since loader 102 and unloader 103 have mutually similar constitutions and operate in the same manner, an explanation is provided only for loader 102.

To begin with, when a command signal is emitted by operation of keyboard 148 (see FIG. 22) and so forth, CPU 147 rotates each pulse motor 121a, 122a, 135a, 136a and 141a in reverse as shown in FIG. 20 to move each regulating member 133, 134 and 139 as well as both guide rails 117 and 118 in the direction in which they move away from each other to position them the movement limit positions set as their respective reference positions (shown as Step $S2_1$ in FIG. 23).

While in this state, lead frames L/F to be newly handled by said apparatus are placed by an operator between both guide rails 117 and 118, namely onto heater plate 105.

Figure 25:
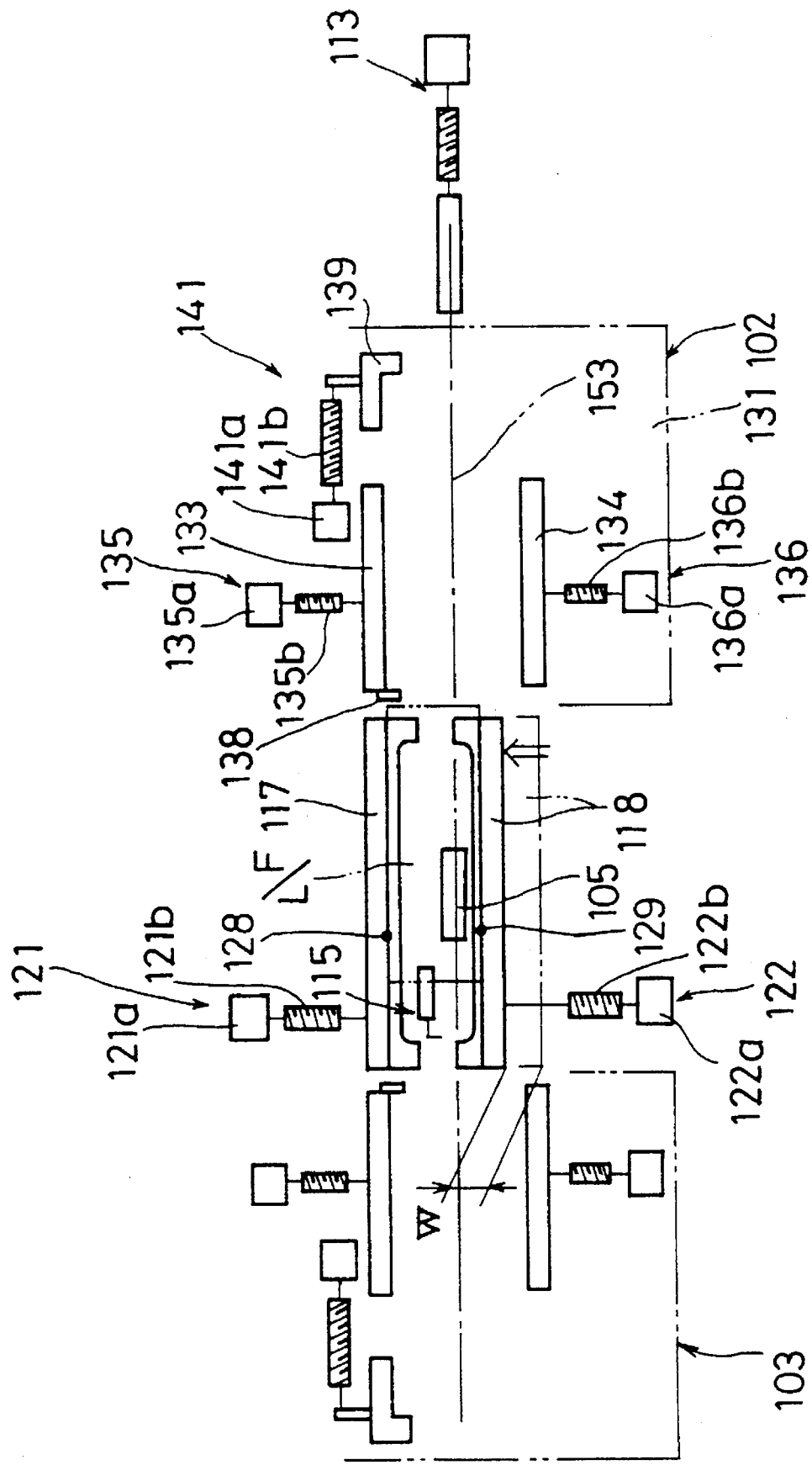
FIG. 25 is a schematic diagram of the operation of the apparatus shown in FIGS. 20 and 21.
Figure 26:
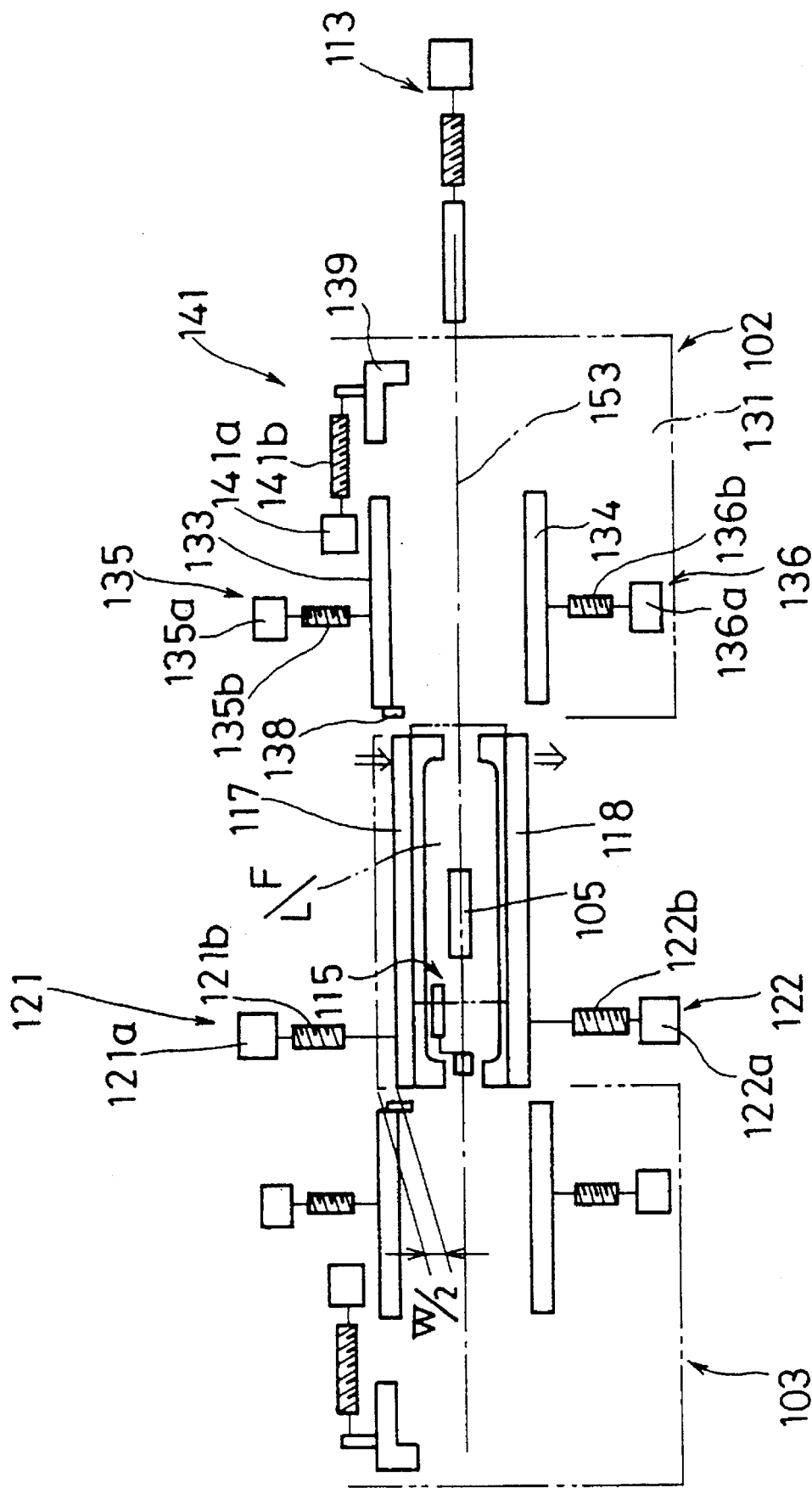
FIG. 26 is a schematic diagram of the operation of the apparatus shown in FIGS. 20 and 21.

Continuing, pulse motor 122a for driving guide rail 118 is rotated in the forward direction and said guide rail 118 is moved towards the other guide rail 117 as shown in FIG. 25. Said pulse motor 122a is stopped based on a detection signal emitted by sensors 128 and 129 when lead frame L/F, pushed to the side of guide rail 117 by said guide rail 118, is detected by said each of said sensors (Steps $S2_2$ to $S2_4$). As a result, lead frame L/F is pinched from both sides by both guide rails 117 and 118.

After the above procedure, pulse motor 121a is rotated in the forward direction and the other pulse motor 122a is rotated in reverse (Step $S2_5$). As a result, both guide rails 117 and 118 are moved in synchronization in the same direction, at the same resolution and at the same speed as shown with the arrows in FIG. 26. Said pulse motors 121a and 122a are stopped when the center in the direction of width of lead frame L/F is aligned with center 153 of the prescribed path over which lead frames L/F are to be guided (Steps $S2_6$ and $S2_7$). In this case, center 153 of the above-mentioned prescribed path refers to the center of indentation 105a formed in heater plate 105.

Furthermore, when both guide rails 117 and 118 are moved in the same direction so as to align the center in the direction of width of lead frame L/F with center 153 of the prescribed path as described above, the amount of movement of both guide rails 117 and 118 is set to W/2 (see FIG. 26) if the amount of movement from the reference position to the stopping position of only guide rail 118 performed in the previous step is taken to be W (see FIG. 25).

Figure 29:
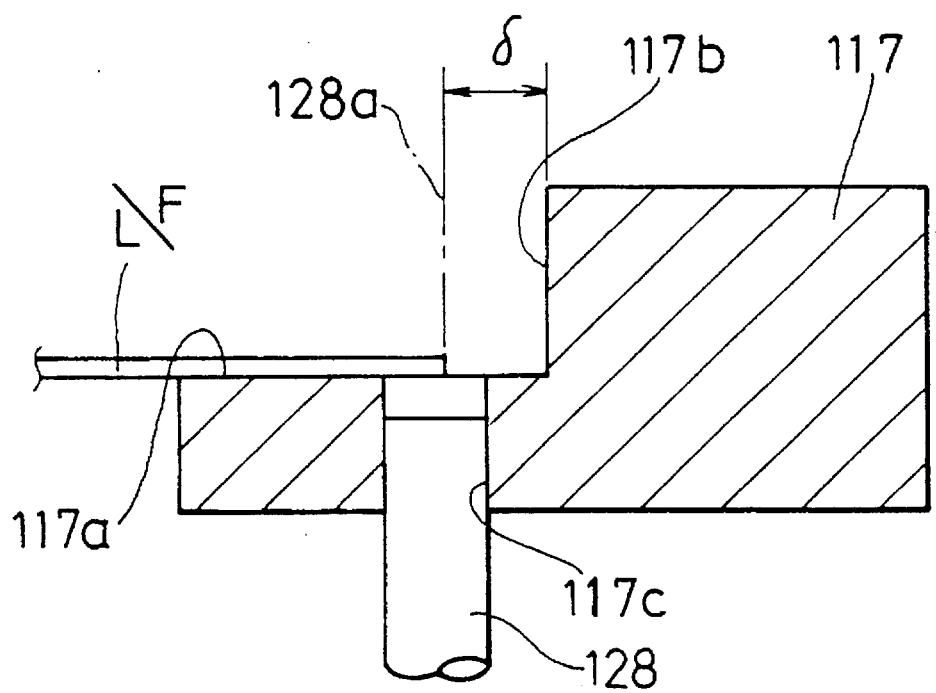
FIG. 29 is a longitudinal cross-sectional view showing a variation of a portion of the apparatus shown in FIGS. 20 and 21.

When the positioning operation of lead frame L/F described above has been completed, pulse motors 121a and 122a are each rotated slightly in reverse (Step $S2_8$). As a result, the optimum gap δ is provided between vertical receiving surfaces 117b and 118b equipped on both the above-mentioned guide rails 117 and 118 and both side edges of lead frame L/F as shown in FIG. 21, thereby allowing transport of lead frame L/F. Furthermore, as shown in FIG. 29, if, for example, sensor 128 is installed so that optical axis 128a of its irradiated light is at the position of the above-mentioned δ from receiving surface 117b of guide rail 117, and the side edge of lead frame L/F is detected by this, the above-mentioned guide rail return operation for providing gap δ is not necessary. This applies similarly to sensor 129 provided on the other guide rail 118.

When positioning of lead frame L/F is completed as described above, each of regulating members 133, 134 and 139 for regulating magazine M are then operated as described below and positioned at the position corresponding to this positioned lead frame L/F, namely the position at which they are able to regulate the position of magazine M.

Figure 27:
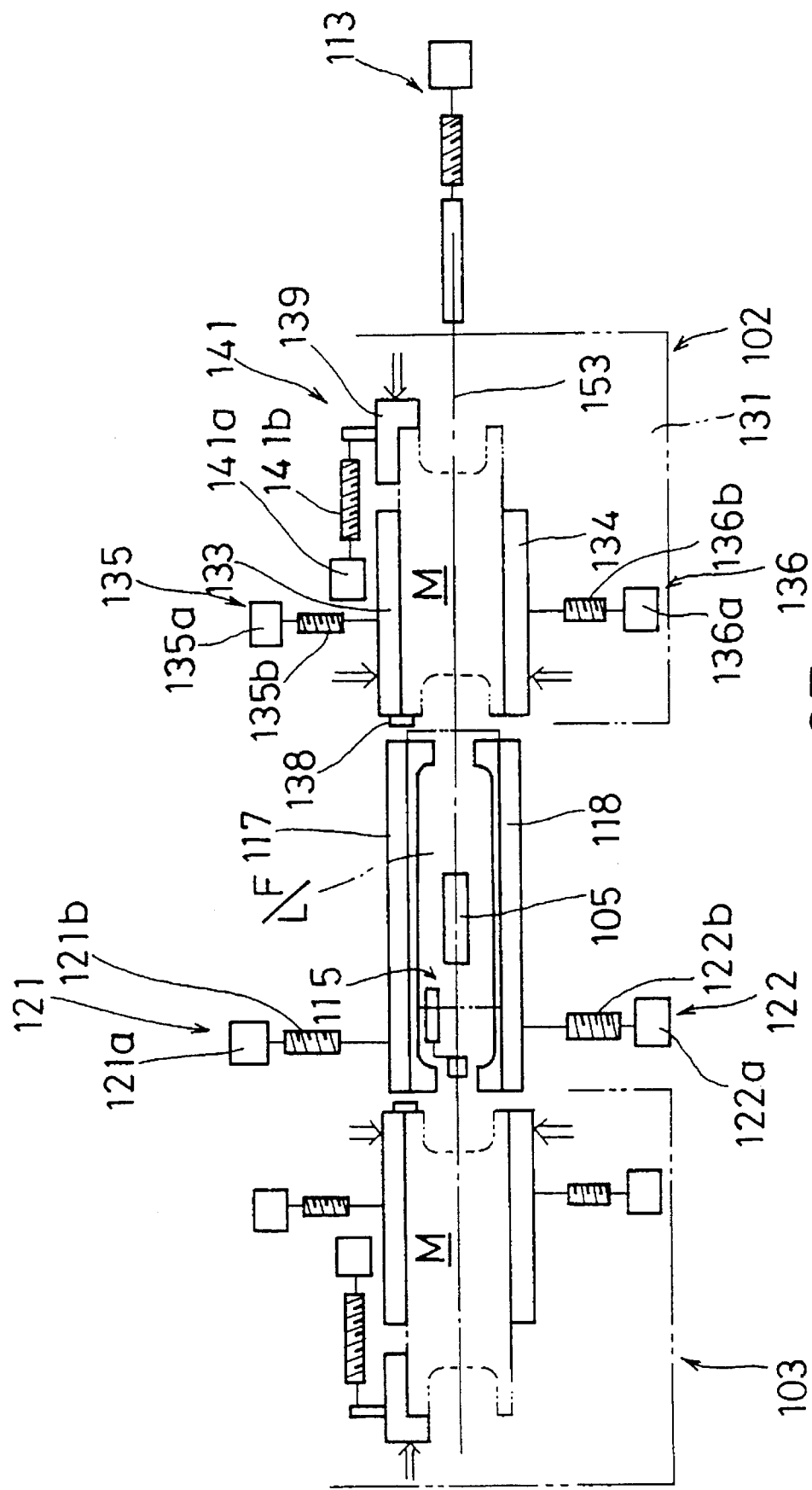
FIG. 27 is a schematic diagram of the operation of the apparatus shown in FIGS. 20 and 21.
Figure 28:
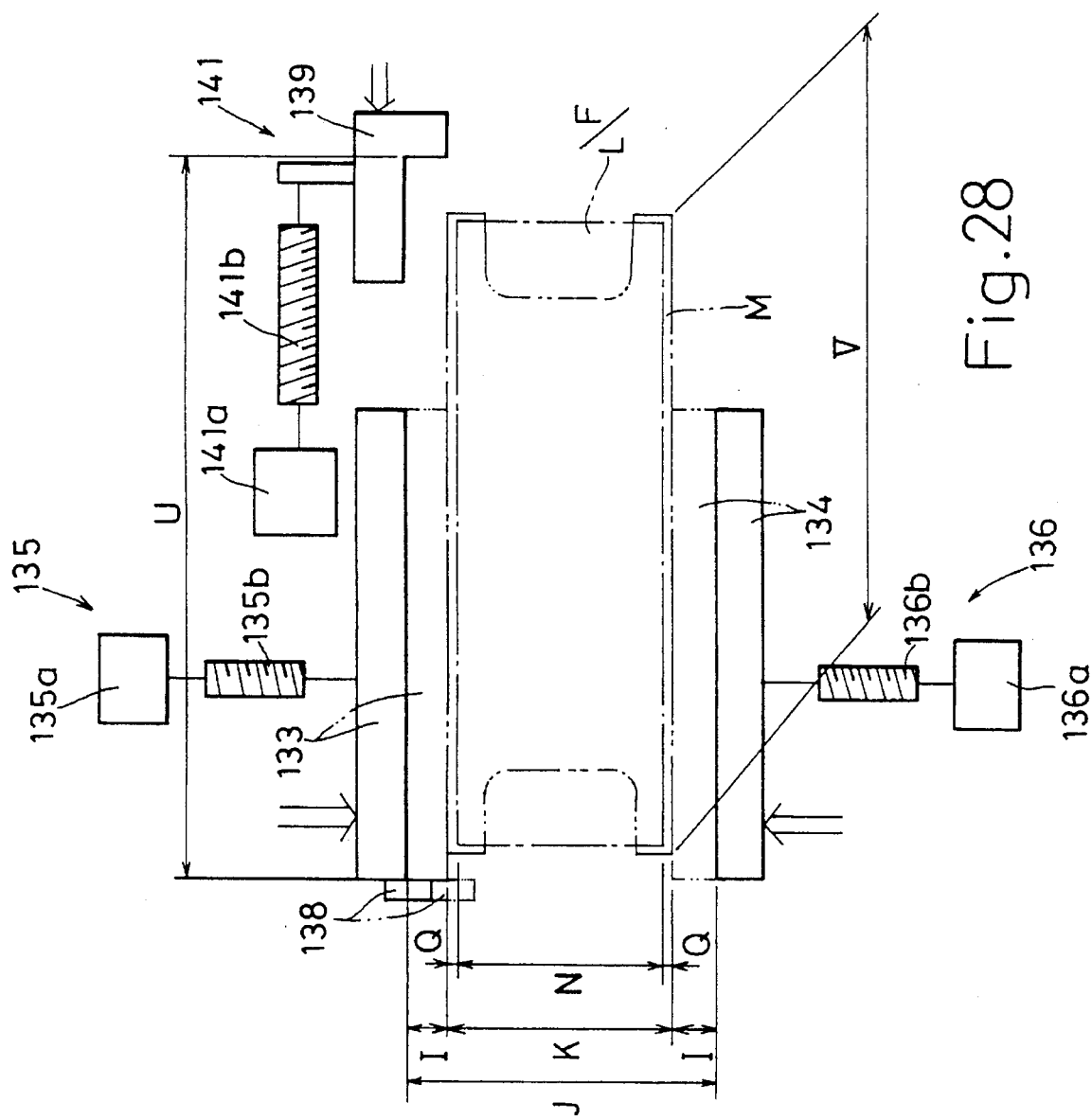
FIG. 28 is a schematic diagram of the operation of the apparatus shown in FIGS. 20 and 21.

First of all, pulse motors 135a and 136a are each rotated in the forward direction (Step S2$_9$). A pair of regulating members 133 and 134 for regulating the position of magazine M by pinching it from its sides as shown with the arrows in FIGS. 27 and 28 are moved in the direction in which they approach each other by a respectively equal distance I (shown in FIG. 28) from a reference position indicated with the solid line. Said regulating members 133 and 134 then reach the regulating positions indicated with the double dot broken lines, namely the positions at which they are able to regulate the position of magazine M. However, magazine M may or may still not be filled at this point. The reaching of these regulating positions by both regulating members 133 and 134, namely the movement of said regulating members 133 and 134 by the above-mentioned distance I, is confirmed by a counter (not shown) equipped on CPU 147 (see FIG. 22) counting the pulse signals emitted corresponding to the angle of rotation of each pulse motor 135a and 136a by a second detection device in the form of an encoder (not shown) equipped on each of said pulse motors 135a and 136a (Step S2$_{10}$). Both pulse motors 135a and 136a are then stopped when this is confirmed (Step S2$_{11}$).

The following provides an explanation of the manner of determining the above-mentioned distance I.

In FIG. 28, since both regulating members 133 and 134 are located at preset reference positions before performing the operation of approaching each other, distance J between both said regulating members is known. Accordingly, the above-mentioned distance I can be determined by subtracting dimension K of the width of magazine M attempting to be regulated from this distance J and dividing that remainder by two.

Since a magazine which is able to contain lead frame L/F for positioning which is already placed on heater plate 105 is selected for magazine M to be regulated, the above-mentioned dimension K of the width of magazine M can be determined by knowing dimension N of the width of said lead frame L/F. Namely, although symbol Q in FIG. 28 indicates the thickness of the side wall of magazine M (also shown in FIG. 31), this thickness Q is roughly the same size for each of the magazines made available to accommodate various types of lead frames. Consequently, the above-mentioned dimension of width K is the value which results from adding twice the value of this thickness Q to dimension N of the width of lead frame L/F.

Dimension N of the width of lead frame L/F can be determined from the result of the amount of operation of both guide rails 117 and 118 performed in a previous step.

Namely, in FIG. 21, since guide rails 117 and 118 are located at preset reference positions before approaching each other, the distance between them, in this case the distance T between each receiving surface 117b and 118b, is known. As shown in FIG. 25, since both guide rails 117 and 118 enter a state in which they pinch lead frame L/F as a result of one guide rail 118 moving by an amount W towards the other guide rail 117 from this stationary state, dimension N of the width of lead frame L/F can be obtained as the value resulting from subtracting W from the above-mentioned distance T. Furthermore, since pulse motor 122a for operating this guide rail 118 is equipped with an encoder that emits pulse signals corresponding to its angle of rotation, the above-mentioned distance W can be obtained by counting the pulse signals with a counter equipped on CPU 147 (see FIG. 22).

In summary of what has been explained thus far, it can be seen that the previously mentioned distance I is determined according to the equation:

$$I=(J-T+W-2Q)/2.$$

As shown in FIG. 22, CPU147 is equipped with a control circuit 147a that performs arithmetic operations based on this equation. Said control circuit 147a calculates W from the angle of rotation of pulse motor 122a and substitutes that value in said equation. Both pulse motors 135a and 136a are then rotated based on the result of that calculation resulting in both regulating members 133 and 134 being moved by distance I to reach the regulating positions.

Once positioning of both regulating members 133 and 134 has been completed in the manner described above, each pulse motor 135a and 136a is slightly rotated in reverse (Step S2$_{12}$). As a result, a suitable gap (not shown) is provided between magazine M to be regulated and both regulating members 133 and 134.

Continuing after or in parallel with the above-mentioned positioning operation of regulating members 133 and 134, positioning of regulating member 139 is performed for regulating the position of magazine M in its lengthwise direction. Furthermore, as described above, this regulating member 139 and regulating member driving device 141 which drives it are attached to the above-mentioned regulating member 133. In said constitution, pulse motor 141 is first rotated in the forward direction (Step S2$_{13}$). Regulating member 139 then moves towards the other regulating member 138 as the stationary side (this is also attached to regulating member 133) as indicated with the arrow in FIGS. 27 and 28, reaching the regulating position where it is able to regulate the position of said magazine M as shown in FIG. 27.

The reaching of this regulating position by regulating member 139 is confirmed by a counter (not shown) equipped on CPU 147 (shown in FIG. 22) counting the pulse signals emitted corresponding to the angle of rotation of pulse motor 141a by a second detection device in the form of an encoder (not shown) equipped on said pulse motor 141a (Step S2$_{14}$). Pulse motor 141a is then stopped when this is confirmed (Step S2$_{15}$).

The distance over which the above-mentioned regulating member 139 moves until it reaches the regulating position where it regulates the position of magazine M is determined in the manner described below.

Namely, as shown in FIG. 28, when the distance between each regulating surfaces of both regulating members 138 and 139 before movement is taken to be U and the length of magazine M is taken to be V, the above-mentioned distance of movement is obtained with U–V. Since regulating member 139 is located at a preset reference position prior to movement, distance U is known. Since length V of selected magazine M is also known, U–V can be determined.

CPU 147 calculates this value of U–V and rotates pulse motor 141a based on the result of this calculation to bring regulating member 139 to the regulating position.

Once regulating member 139 has been positioned in the manner described above, the above-mentioned pulse motor 141a is slightly rotated in reverse (Step S2$_{16}$). As a result, a suitable gap (not shown) is provided between magazine M to be regulated and the above-mentioned regulating members 138 and 139. Thus, magazine M is able to vertically move freely (move freely in the direction perpendicular to the surface of the paper in the drawings) in a state in which it is surrounded while leaving a suitable gap by each regulating member 133, 134, 138 and 139, thus enabling magazine M to be raised or lowered by an elevator mechanism not shown.

As a result of the series of operations explained thus far, a lead frame to be newly handled and the center in the direction of width of a magazine M containing said lead frame L/F is aligned with center 153 of a prescribed path over which lead frame L/F is to be guided, namely the center of indentation 105a of heater plate 105. Furthermore, as shown in FIG. 21, in the case the center of island 109 of lead frame L/F is aligned with the center in the direction of width of said lead frame L/F, the center of this island 109 aligns with center 153 of the above-mentioned prescribed path.

Figure 30:
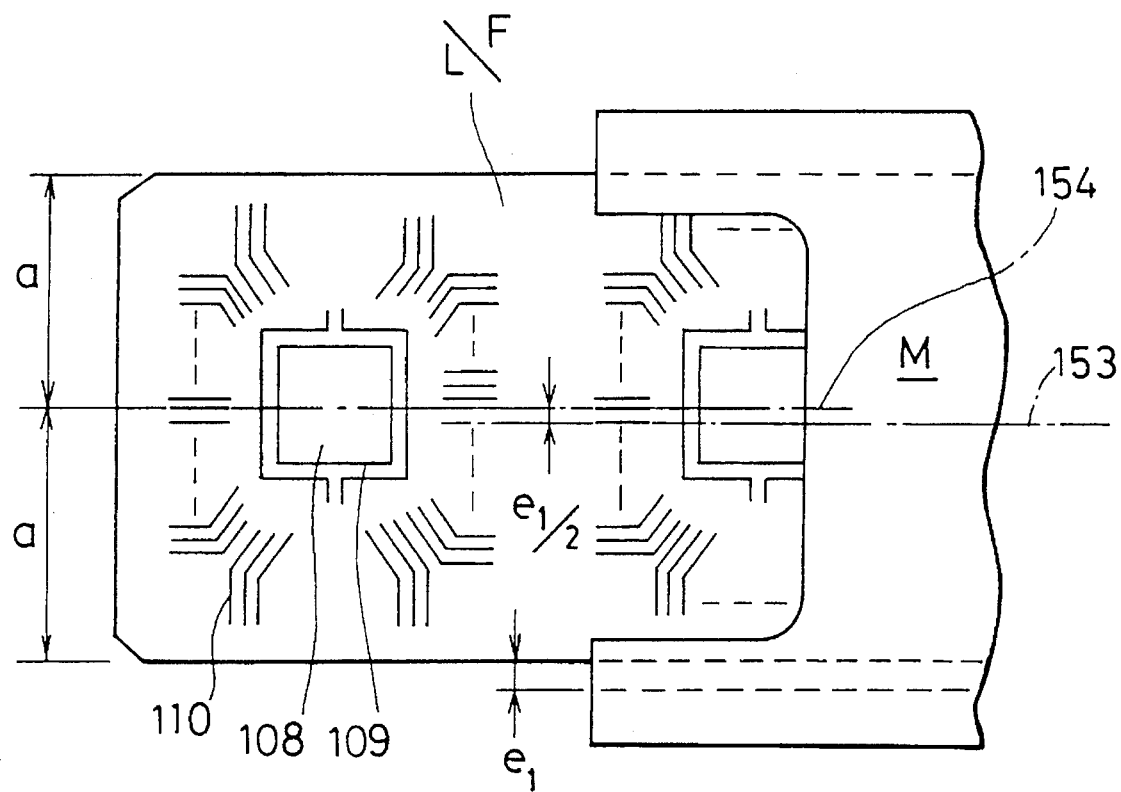
FIG. 30 is a schematic diagram of the operation of the apparatus shown in FIGS. 20 and 21.
Figure 31:
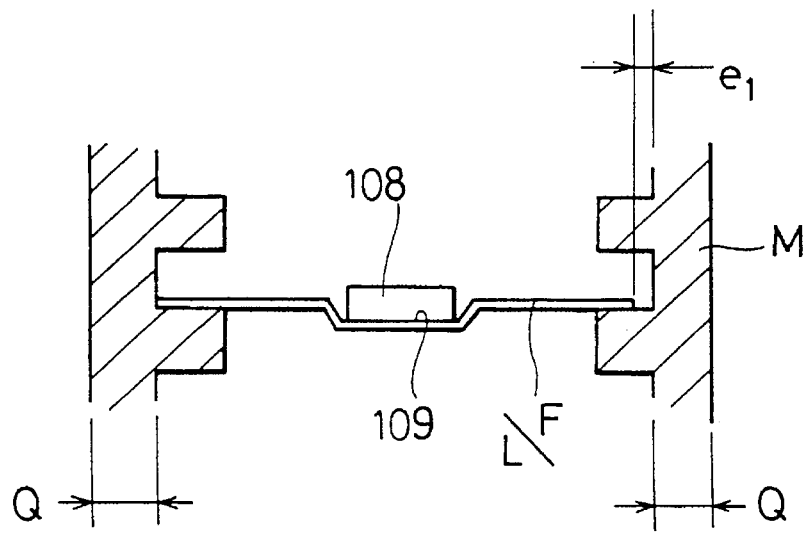
FIG. 31 is a schematic diagram of the operation of the apparatus shown in FIGS. 20 and 21.

However, as shown in FIGS. 30 and 31, maximum gap $e_1$ is formed between the side edge of lead frame L/F and the inner wall surface of magazine M to enable lead frame L/F to be pushed out and contained smoothly with respect to magazine M. Accordingly, in the case lead frame L/F is contained in magazine M biased to one side of said magazine M as shown in the drawings, even if the center in the direction of width of magazine M is aligned with center 153 of the prescribed path as described above, center 154 of island 109 on which said lead frame L/F is provided within said magazine M (shown in FIG. 30) is not aligned as a result of being displaced by an amount of $e_1/2$ with respect to center 153 of said prescribed path. In this case, operation continues through that described above followed by the operation described below in order to correct this displacement.

Furthermore, the explanation thus far has been premised on each lead frame L/F being in a state within magazine M wherein the above-mentioned displacement does not occur. In the case each lead frame L/F is displaced to one side in magazine M as described above, since there is the risk of the pushing out and containment operation of lead frame L/F lacking smoothness due to the side edge of lead frame L/F making contact with the inner wall surface of magazine M, correction is performed so that each lead frame L/F is positioned in the center of magazine M. This correction operation is shown in the flow chart of FIGS. 23 and 24. More specifically, said correction operation is performed by slightly rotating pulse motors 135a and 136a in synchronization to move both regulating members 133 and 134 in the same direction, thereby moving magazine M in the direction in which displacement is corrected.

Figure 32:
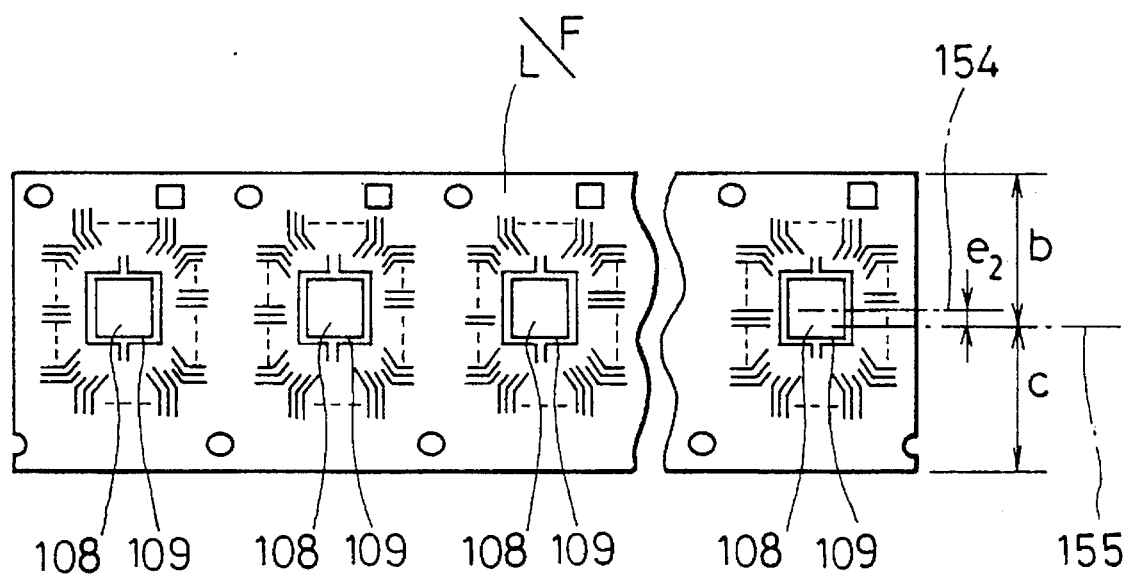
FIG. 32 is an overhead view of another example of a lead frame handled in the apparatus shown in FIGS. 20 and 21.
Figure 33:
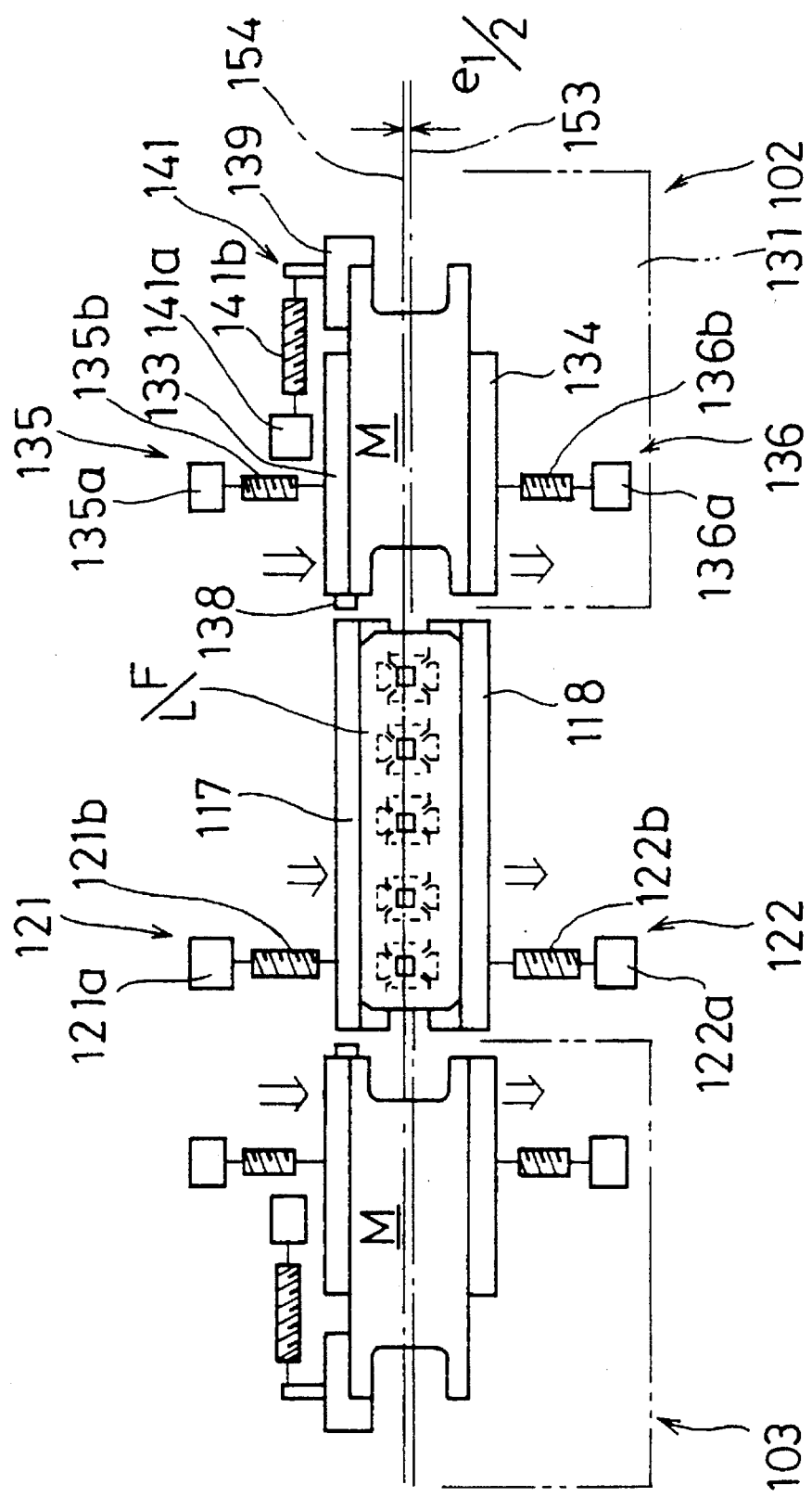
FIG. 33 is a schematic diagram of the operation of the apparatus shown in FIGS. 20 and 21.

Furthermore, as shown in FIG. 32, there are also lead frames L/F which are formed in which center 154 of island 109 is displaced by an amount $e_2$ with respect to center 155 in the direction of width of said lead frames. In this case as well, a displacement correction operation is performed in the manner described below so that center 154 of this island 109 is aligned with center 153 of the prescribed path.

Namely, since center 154 of island 109 and center 153 of the prescribed path are displaced by $e_2/2$, in order to correct this amount of displacement, while pulse motors 121a and 135a are rotated in the forward direction, other pulse motors 122a and 136a are rotated in reverse. As a result, each regulating member 133 and 134 along with both guide rails 117 and 118 are moved in synchronization in the same direction, at the same resolution and at the same speed, and stopped when the center in the direction of width of lead frame L/F and magazine M is shifted by the above-mentioned amount of displacement $e_1/2$ with respect to center 153 of the prescribed path, namely when the above-mentioned center 154 of island 109 aligns with center 153 of the prescribed path (Steps $S2_{17}$ to $S2_{19}$).

Furthermore, in addition to confirmation that center 154 of island 109 is aligned with center 153 of the above-mentioned prescribed path, namely the center of indentation 105a of heater plate 105, being performed by an image signal obtained from image recognition apparatus 149 (see FIGS. 21 and 22) being sent to CPU 147 (shown in FIG. 22), it is also performed by the operator himself visually monitoring a microscope (not shown) arranged at a position above heater plate 105 or a monitor television (not shown) connected to said image recognition apparatus 149.

Thus, adjustment of the transport path corresponding to the lead frames L/F to be handled by the apparatus is completed.

When the positions of magazine M and lead frames L/F have been set in the manner described above, CPU 147 (see FIG. 22) inputs and stores those set positions, more specifically, the set positions of each regulating member 133 and 134 as well as 139 along with both guide rails 117 and 118, in RAM 151. When the same type of lead frame L/F is handled by the apparatus again, CPU 147 recalls this stored data and immediately performs position setting.

When adjustment in the direction of frame width as described above is completed, setting of feeding of lead frames L/F in the direction following the above-mentioned prescribed path is performed according to the procedure described below.

To begin with, feed mechanism 114 (see FIG. 20) is operated which results in lead frame L/F being fed a minute distance at a time. While in this state, adjustment is performed in the same manner as during the above-mentioned adjustment in the direction of frame width by CPU 147 or by the operator using image recognition apparatus 149 while confirming the resulting image. Furthermore, crosshairs are simultaneously shown to serve as a reference within the resulting image.

The leading edge of the first lead frame L/F fed is confirmed to have reached the intersection of the above-mentioned crosshairs, and this coordinate position is stored in RAM 151 as a first reference.

Next, the center of the first island 109 from the leading edge of lead frame L/F is confirmed to have reached the intersection of the crosshairs, and this coordinate position is stored in RAM 151 as a second reference.

Then, after confirming that the center of the second island 109 from the leading edge has reached the intersection of the crosshairs, the amount of feeding of lead frame L/F from the above-mentioned second reference to this point is computed and stored in RAM 151. This determined amount of feeding corresponds to the pitch between neighboring islands 109. Furthermore, this amount of feeding is determined by monitoring the amount of operation of the above-mentioned feed mechanism 114 by an encoder and so forth not shown. In addition, aside from immediately determining the pitch by computing the amount of feeding from the first island 109 to the second island 109 as described above, the lead frames may be fed all at once until the center of the nth island starting with the third island aligns with the crosshairs, and the mean pitch may then be determined as the value resulting from dividing the amount of feeding from the first island until the nth island is reached, namely the distance between centers of said islands, by N−1.

After performing the above-mentioned operation, lead frame L/F is fed until the rear end of said lead frame L/F reaches the intersection of the crosshairs. The total amount of feeding until this point from the above-mentioned first reference is then stored in RAM 151. This total amount of feeding is the total length of lead frame L/F.

Each of the measured values stored in RAM 151 in the above manner are reproduced by recalling this stored information as necessary.

Furthermore, although the reference positions during operation of each regulating member 133 and 134 along with both guide rails 117 and 118 are set at the movement limit positions or their vicinity in the direction in which regulating members 133 and 134 as well as both guide rails 117 and 118 move away from each other in the present embodiment, said reference positions can also be set at arbitrary positions. For example, if there is a lead frame that has been transported before the lead frame to be newly handled by the apparatus, the position that coincides with this prior lead frame and the magazine which contains it may be used as the reference position, thereby enabling the position which coincides with a new lead frame and magazine to be computed based on this original reference position.

In addition, adjustment of the transport path can also be performed by following the positions of the guide rails and so forth according to the images and so forth obtained from image recognition apparatus 149 without setting reference positions as described above.

In addition, although the adjustment operation is performed in the present embodiment by making one of the guide rails, namely guide rail 117, stationary and moving only the other guide rail, namely guide rail 118, prior to moving both guide rails 117 and 118 in the same direction to align the center in the direction of width of lead frame L/F with center 153 of the prescribed path, conversely, said guide rail 118 may be made to be stationary while moving guide rail 117, or both guide rails 117 and 118 may be operated together.

Moreover, although sensors 128 and 129, in the form of a first detection device for detecting that guide rails 117 and 118 have reached the state where they are able to guide lead frame L/F by engaging with said lead frame L/F, and encoders (not shown: equipped on each pulse motor 135a, 136a and 141a), for detecting that each regulating member 133, 134, 138 and 139 has reached the position where it is able to regulate the position of magazine M, are provided in the present embodiment, each of these sensors and encoders is not required if this detection is performed by using image recognition apparatus 149 and so forth.

In addition, in the case it becomes necessary to replace heater plate 105 when handling a certain type of lead frames L/F, and indentation 105a of said heater plate 105 ends being displaced from island 109 of lead frame L/F as a result of performing that replacement, since it is only necessary to perform an operation which aligns island 109 with indentation 105a by moving both regulating members 133 and 134 along with both guide rails 117 and 118 in the same direction, adjustment can be performed extremely quickly and easily.

In addition, although the adjustment of the transport path of lead frames in a wire bonding apparatus is indicated in the present embodiment, it goes without saying that the present invention can also be applied to other apparatuses, substrates and substrate containment devices.

Next, the following provides an explanation of a wire bonding apparatus equipped with a substrate transport apparatus as a third embodiment of the present invention while referring to FIGS. 34 through 38. Furthermore, since said wire bonding apparatus is similarly composed to the wire bonding apparatus as a second embodiment of the present invention shown in FIGS. 20 through 33 with the exception of those portions described below, an explanation of the entire apparatus is omitted, with the explanation only focusing on the essential portion. In addition, the same reference numerals are used for those constituent members identical to the constituent members of the wife bonding apparatus shown in FIGS. 20 through 33.

Figure 34:
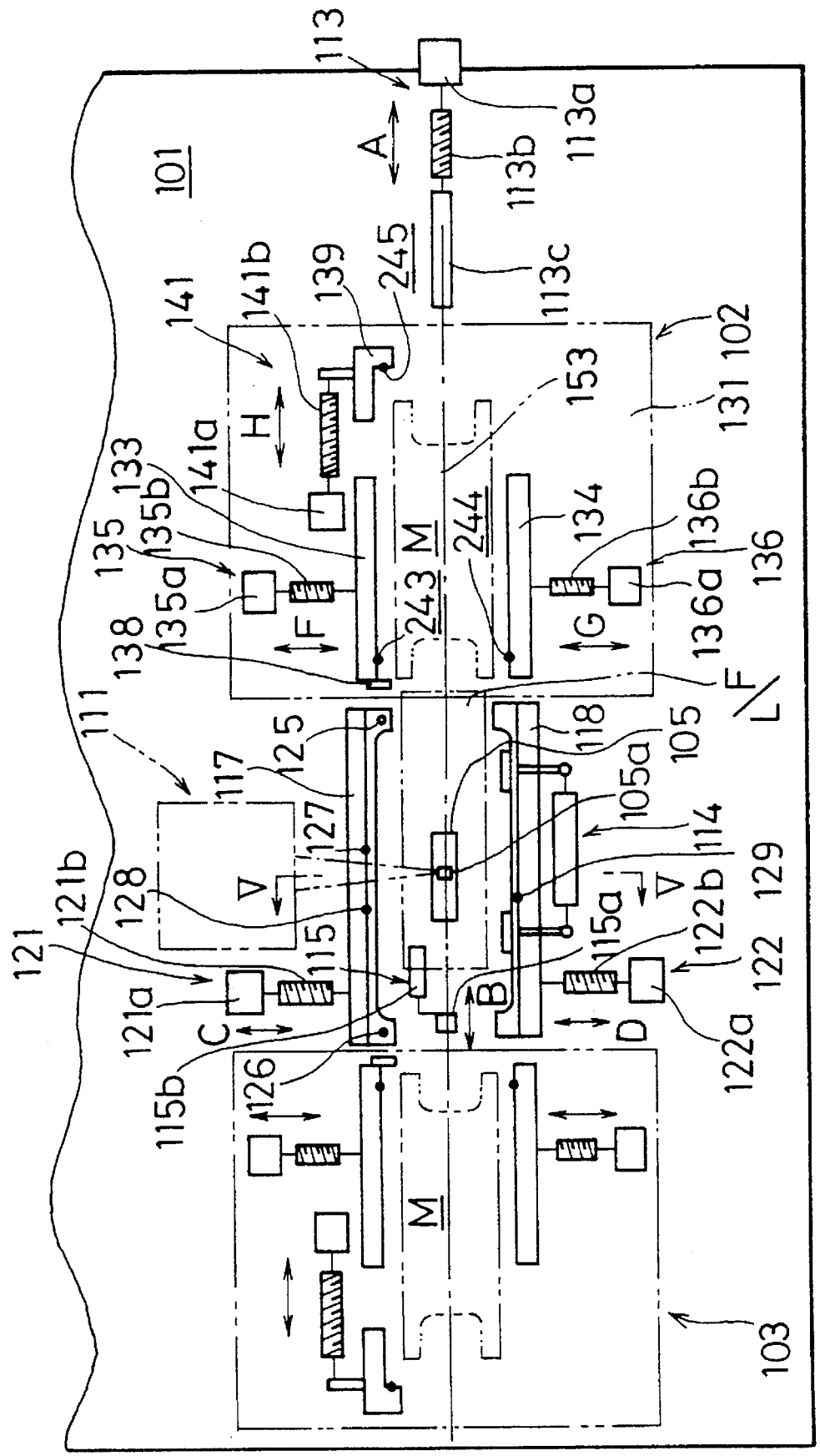
FIG. 34 is an overhead view of the essential portion of a wire bonding apparatus containing a substrate transport apparatus as a third embodiment of the present invention.
Figure 35:
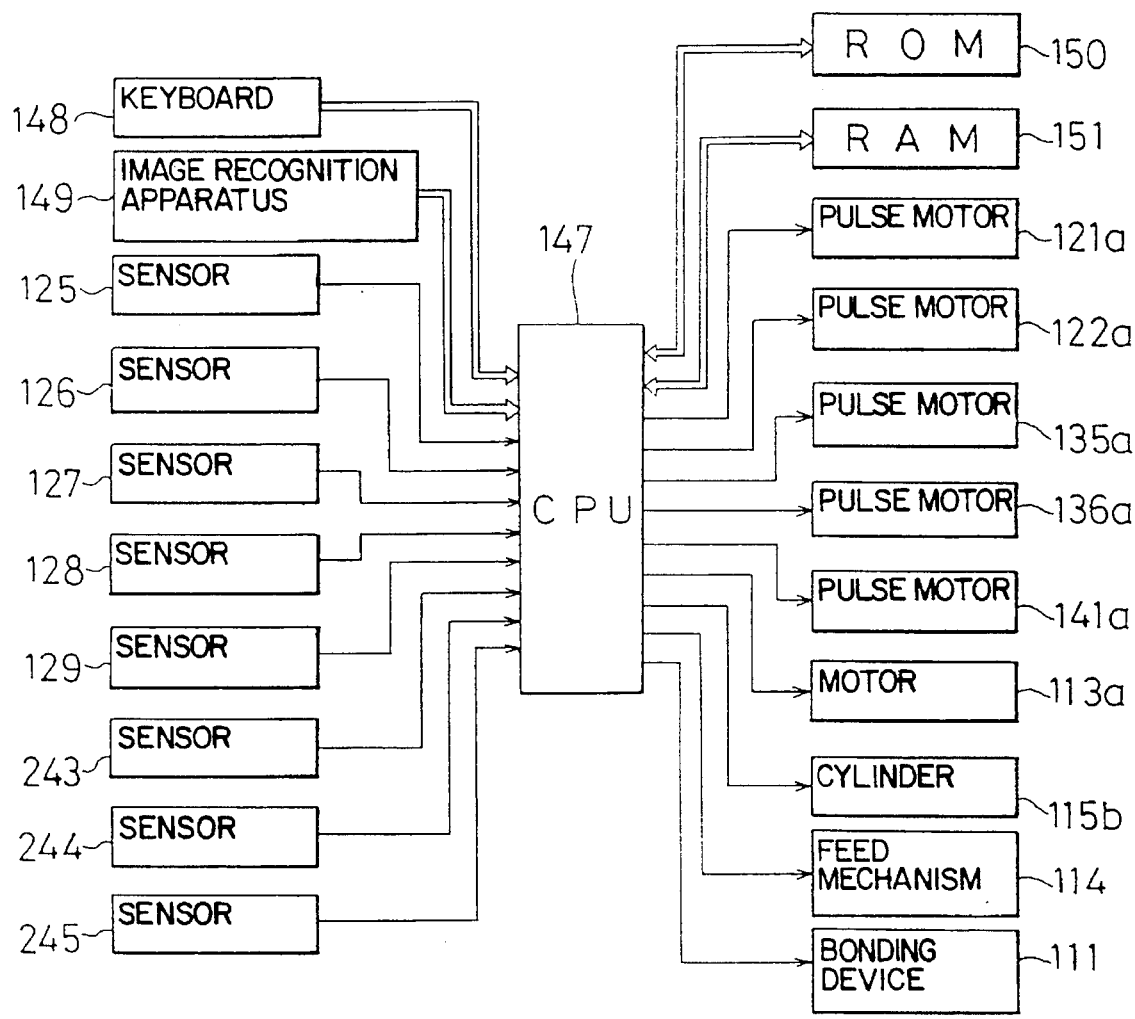
FIG. 35 is a block diagram showing the operational control system of the apparatus shown in FIG. 34.

As shown in FIG. 34, in said wire bonding apparatus, sensors 243, 244 and 245 are respectively provided on each regulating member 133, 134 and 139 for regulating the position of a substrate containment device in the form of magazine M. These sensors act as a second detection device for detecting that each of said regulating members 133, 134 and 139 have reached the position where they are able to regulate the position of magazine M. Accordingly, each pulse motor 135a, 136a and 141a for operating each of said sensors 133, 134 and 139 need not be equipped with an encoder. These sensors 243 to 245 are composed of, for example, reflecting optical sensors, and detection signals emitted by each of said sensors are sent to CPU 147 as shown in FIG. 35.

Each of the above-mentioned sensors 243 to 245 is attached in the manner described below to each regulating member 133, 134 and 139. Furthermore, since the constitutions for attachment of these three sensors are respectively similar, an explanation is provided only for the attachment state of sensor 243 in representation of the other two sensors.

Figure 36:
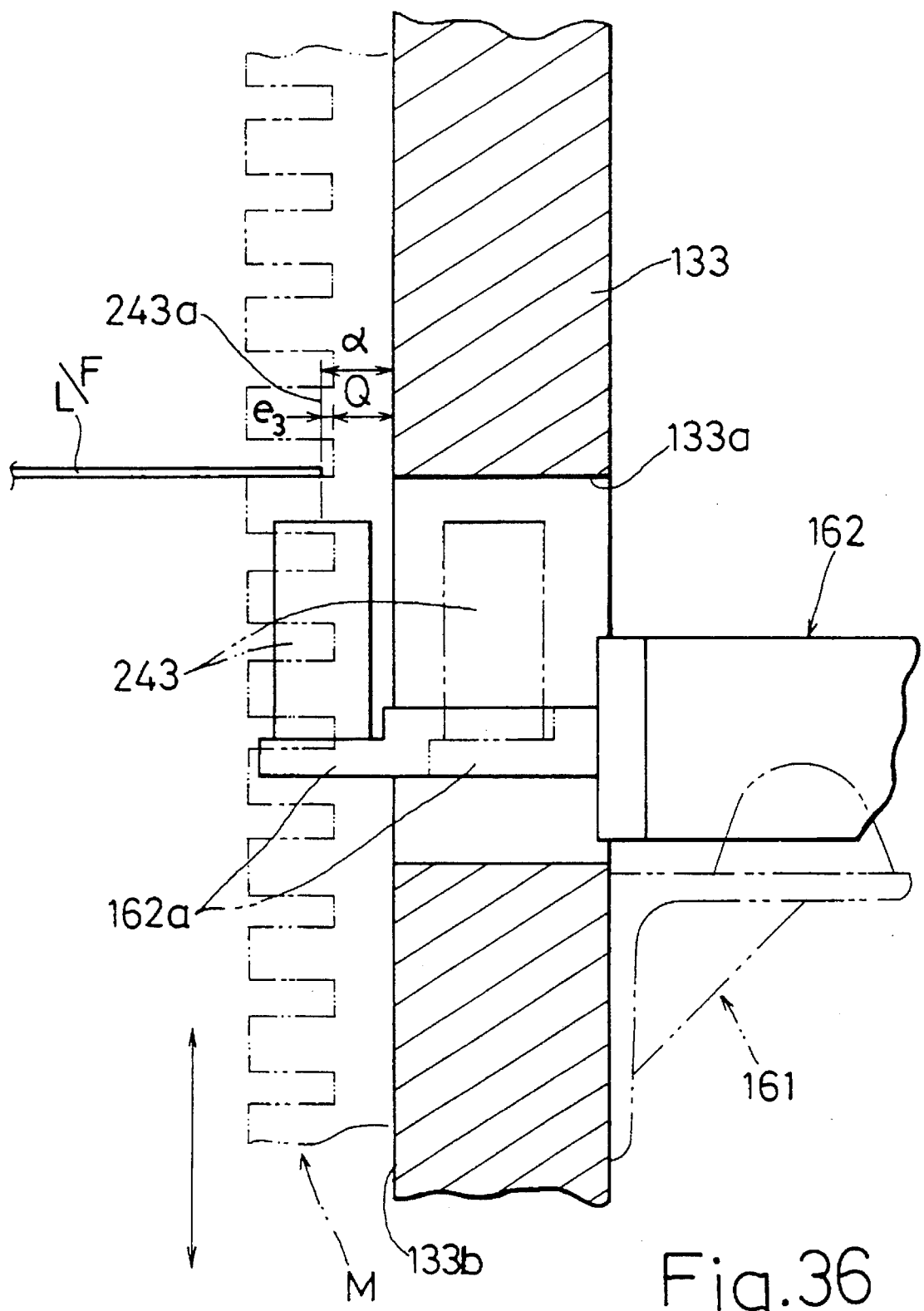
FIG. 36 is a longitudinal cross-sectional view of a portion of the apparatus shown in FIG. 34.
Figure 37:
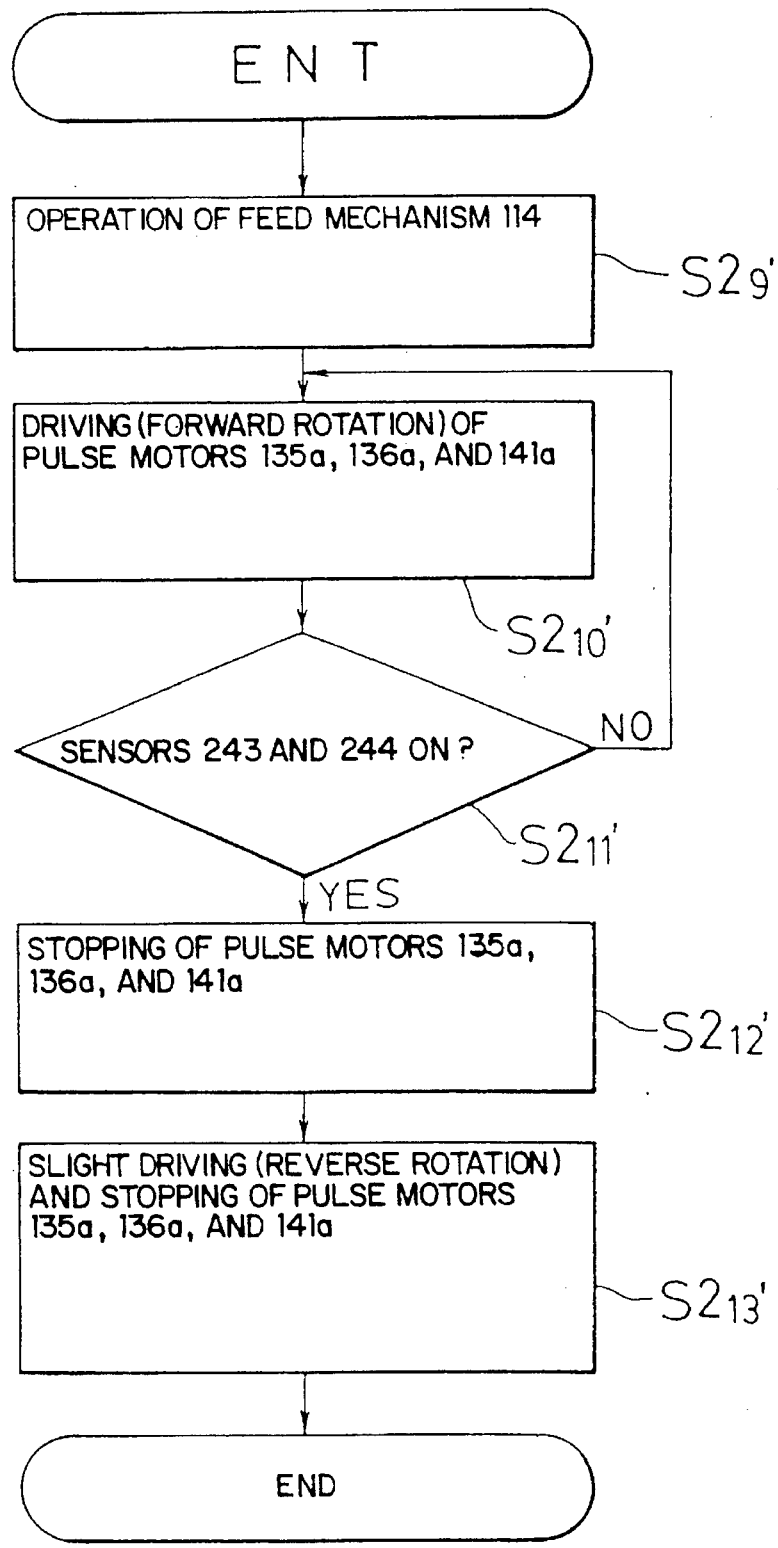
FIG. 37 is a flow chart representing the operation of the apparatus shown in FIG. 34.

As shown in FIG. 36, sensor 243 is mounted on the leading end of rod 162a of air cylinder 162 attached by means of bracket 161 to the outside surface of regulating member 133. Opening 133a is formed in regulating member 133, and rod 162a is inserted through this opening. Thus, sensor 243 moves between a protruding position, at which it is removed by a prescribed distance from regulating surface 133b of regulating member 133 (shown with solid lines) and a contained position, at which it retracts within opening 133a (shown with double dot broken lines), as a result of the reciprocating operation of rod 162a.

As shown in the drawing, when sensor 243 is at the above-mentioned protruding position, optical axis 243a of irradiated light emitted by said sensor 243 is set to be at a position removed by distance $\alpha$ from regulating surface 133b of regulating member 133. This distance $\alpha$ is set to be equal to or slightly greater than thickness Q of the side wall of magazine M. However, this slightly greater distance is gap $e_3$ that forms between the inner surface of the side wall of magazine M and the side end of lead frame L/F contained in said magazine M.

In the above-mentioned constitution, sensor 243 emits a detection signal after detecting the side edge of lead frame L/F. Furthermore, although magazine M demonstrates vertical operation as shown with the arrow in FIG. 36, during this vertical operation, rod 162a of air cylinder 162 is retracted so that sensor 243 is contained within opening 133a and does not interfere with rising and lowering magazine M.

Furthermore, if a constitution is employed wherein each of pulse motors 135a, 136a and 141a, in the form of driving force generation devices respectively having regulating member driving devices 135, 136 and 141 for respectively moving each of the above-mentioned regulating members 133, 134 and 139, is equipped with a signal generation device in the form of an encoder which emits pulse signals corresponding to the amount of operation of each said pulse motor, namely the angle of rotation, each of the above-mentioned sensors 243, 244 and 245 can be eliminated.

Namely, since each regulating member 133, 134 and 139 is not able to move further once it has respectively engaged with lead frames L/F and pinched them from both sides, pulse signals are no longer obtained from the above-mentioned encoders when in this state. Thus, the pulse motors are stopped by detecting this state. Furthermore, in consideration of each pulse motor continuing to rotate excessively for several pulses due to its inertia at this time, it is preferable to rotate each pulse motor in reverse by the same number of excess pulses after stopping. In addition, after this operation, each pulse motor 135a, 136a and 141a is rotated in reverse so that each regulating member 133, 134 and 139 returns to its regulating position at which it regulates the position of magazine M.

Next, the following provides all explanation of operation in the case of changing the type of lead frame L/F handled in the wire bonding apparatus having the above-mentioned constitution while referring to FIGS. 34 through 38. Furthermore, since operation through the procedure of placing a lead frame L/F for positioning on heater 105 by an operator, and said lead frame L/F being positioned with respect to center 153 of a prescribed path by operation of both guide rails 117 and 118 is similar to that of the wire bonding apparatus as a second embodiment of the present invention shown in FIGS. 20 through 33, the following explanation is provided only in regard to operation after that point. Thus, the flow chart shown in FIG. 37 to represent the operation of this apparatus as a third embodiment of the present invention continues from Step $S2_8$ in the flow chart of the apparatus of the second embodiment of the present invention shown in FIGS. 23 and 24.

Figure 38:
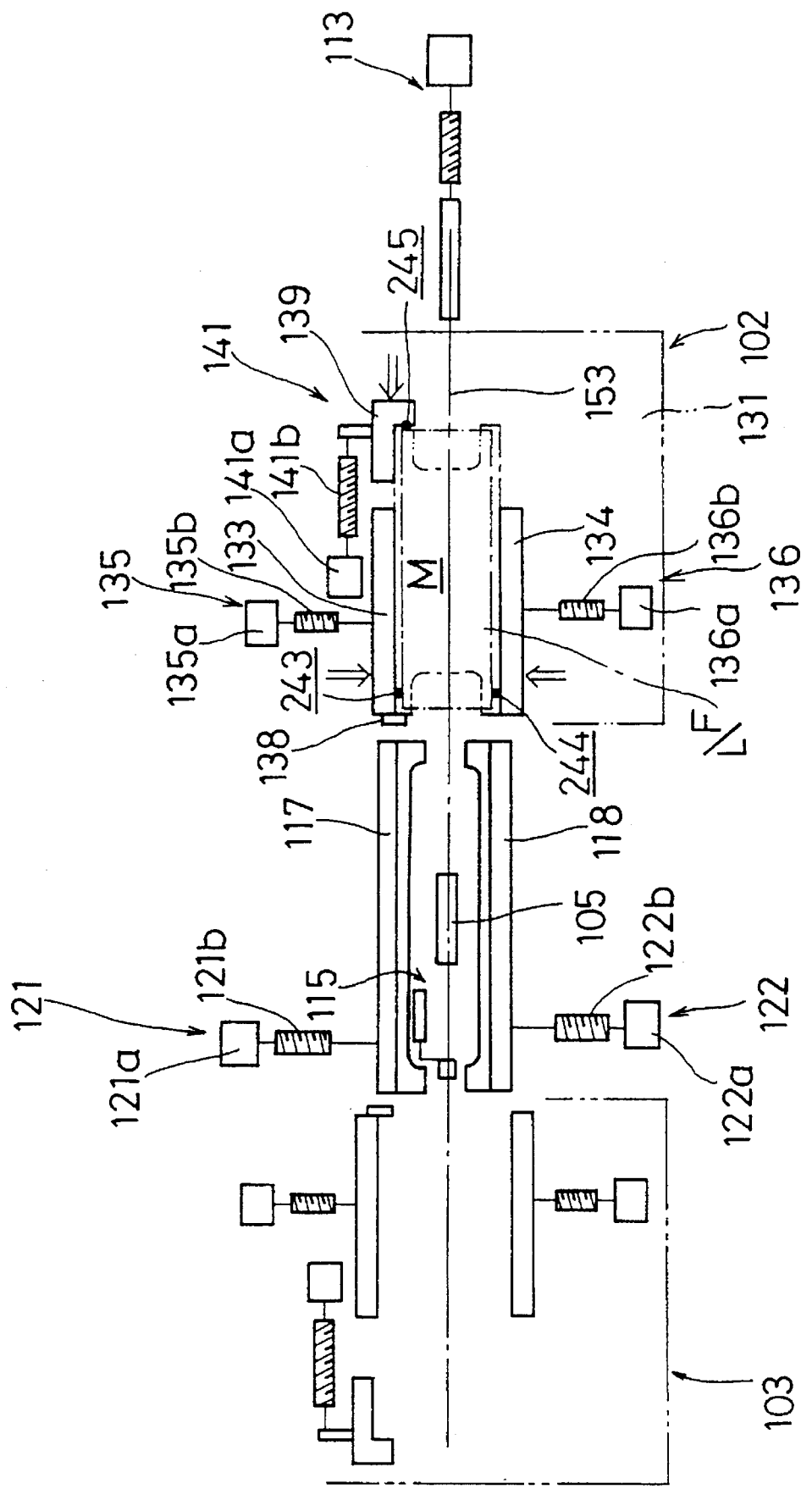
FIG. 38 is a schematic diagram of the operation of the apparatus shown in FIG. 34.

When lead frame L/F is positioned with respect to center 153 of the prescribed path, air cylinder 162 first performs protruding operation as shown in FIG. 36, and sensor 243 is moved to the protruding position. In addition, the other two sensors 244 and 245 are also moved to protruding positions in a similar manner. Feed mechanism 114 (see FIG. 34) is then operated (Step $S2_9$,) and lead frame L/F positioned between guide rails 117 and 118 to reach a position at which it is surrounded by each restricting member 133, 134 and 139 as shown in FIG. 38. After this procedure, pulse motors 135a, 136a and 141a are respectively rotated in the forward direction (Step $S2_{10}$,). Both regulating members 133 and 134 for regulating magazine M from the sides, and regulating member 139 for regulating magazine M in the lengthwise direction, are moved in the direction in which they approach each other as shown with the arrows in FIG. 38, thereby reaching the positions at which they are able to regulate the position of magazine M. However, since each sensor 243 to 245 is protruding from the regulating surface of each regulating member 133, 134 and 139, magazine M is not loaded at this time, but rather is loaded after completion of positioning of each said regulating member 133, 134 and 139.

The reaching of this regulating position by each regulating member 133, 134 and 139 is confirmed by detection signals being emitted by each sensor 243 to 245 (Step $S2_{11}$,). When this is confirmed, each pulse motor 135a, 136a and 141a is stopped (Step $S2_{12}$,).

Once positioning of each regulating member 133, 134 and 139 has been completed in the manner described above, each pulse motor 135a, 136a and 141a is slightly rotated in reverse (Step $S2_{13}$,). As a result, a suitable gap is provided between magazine M to be regulated and each of the above-mentioned regulating members 133, 134, 138 and 139. Thus, magazine M can be raised or lowered by an elevator mechanism not shown.

As a result of the series of operations explained thus far, a lead frame to be newly handled and the center in the direction of width of a magazine M containing said lead frame L/F are aligned with center 153 of a prescribed path over which lead frame L/F is to be guided, namely the center of indentation 105a of heater plate 105. In this state, magazine M is loaded within the space demarcated by each of the above-mentioned regulating members 133, 134, 138 and 139.

Following this procedure, correction of displacement and setting of feeding and so forth are performed in the same manner as the previously described wire bonding apparatus as a second embodiment of the present invention as necessary.

Next, the following provides an explanation of a wire bonding apparatus containing a substrate transport apparatus as a fourth embodiment of the present invention. Furthermore, since said wire bonding apparatus is similarly composed to the apparatus of the prior art shown in FIGS. 1 through 3 with the exception of those portions described below, an explanation of the entire apparatus is omitted, with the explanation only focusing on the essential portion. In addition, the same reference numerals are used for those constituent members identical to the constituent members of said apparatus of the prior art.

Figure 39:
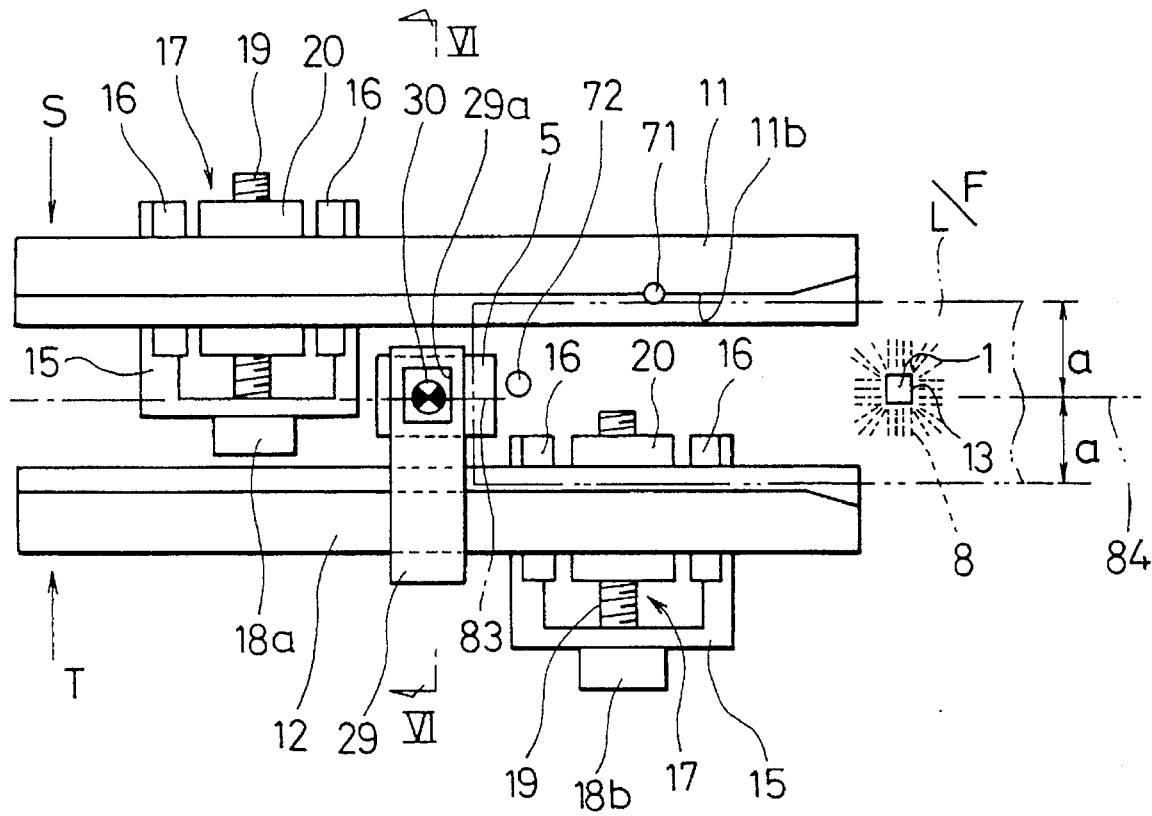
FIG. 39 is an overhead view of the essential portion of a wire bonding apparatus containing a substrate transport apparatus as a fourth embodiment of the present invention.
Figure 40:
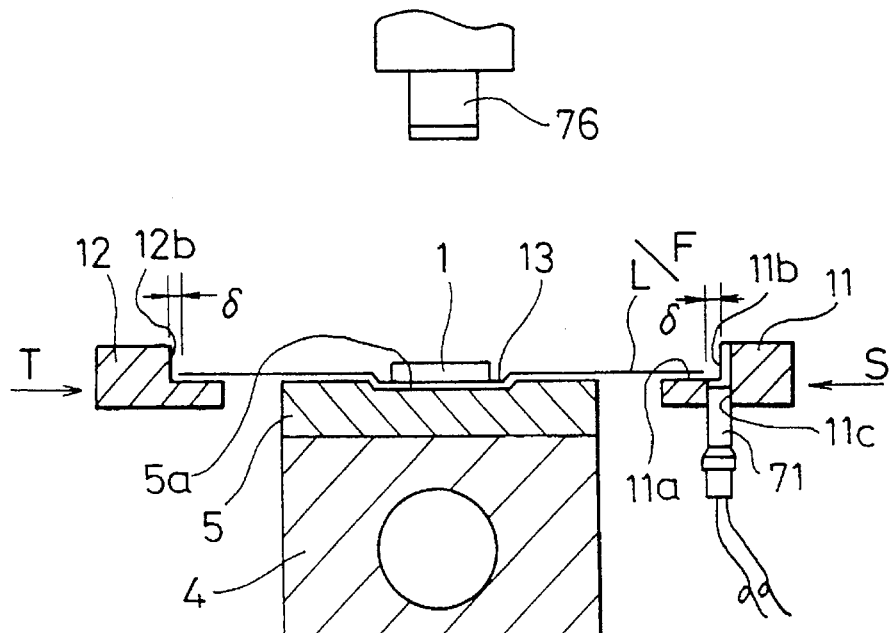
FIG. 40 is a cross-sectional view taken along lines VI—VI relating to FIG. 39.

As shown in FIGS. 39 and 40, sensor 71 is provided on one guide rail 11 in said wire bonding apparatus. This sensor 71 is composed, for example, of a reflective optical sensor, and is attached so that its detecting head is facing upward. More specifically, guide rail 11 has two receiving surfaces 11a and 11b each mutually positioned at a right angle so as to respectively make contact with the lower surface and side edge of lead frame L/F. Sensor 71 is arranged so that irradiated light emitted by said sensor 71 as well as reflected light from lead frame L/F are positioned in a plane that contains vertical receiving surface 11b. Consequently, aperture 11c (as shown in FIG.40) opened at the intersecting portion of receiving surfaces 11a and 11b is formed in guide rail 11, and sensor 71 is inserted into this aperture 11c.

The above-mentioned sensor 71 acts as a detection device that detects that guide rails 11 and 12 have engaged with lead frame L/F and reached a state where they are able to guide said lead frame L/F.

On the other hand, as shown in FIG. 39, another sensor 72 is arranged between both guide rails 11 and 12. This sensor 72 detects that lead frame L/F to be guided by both said guide rails 11 and 12 has arrived between these guide rails, and particularly, at the position at which it can be detected by the above-mentioned sensor 72, followed by emitting a detection signal. Said sensor 72 is composed of a reflective optical sensor in the same manner as the above-mentioned sensor 71.

Figure 41:
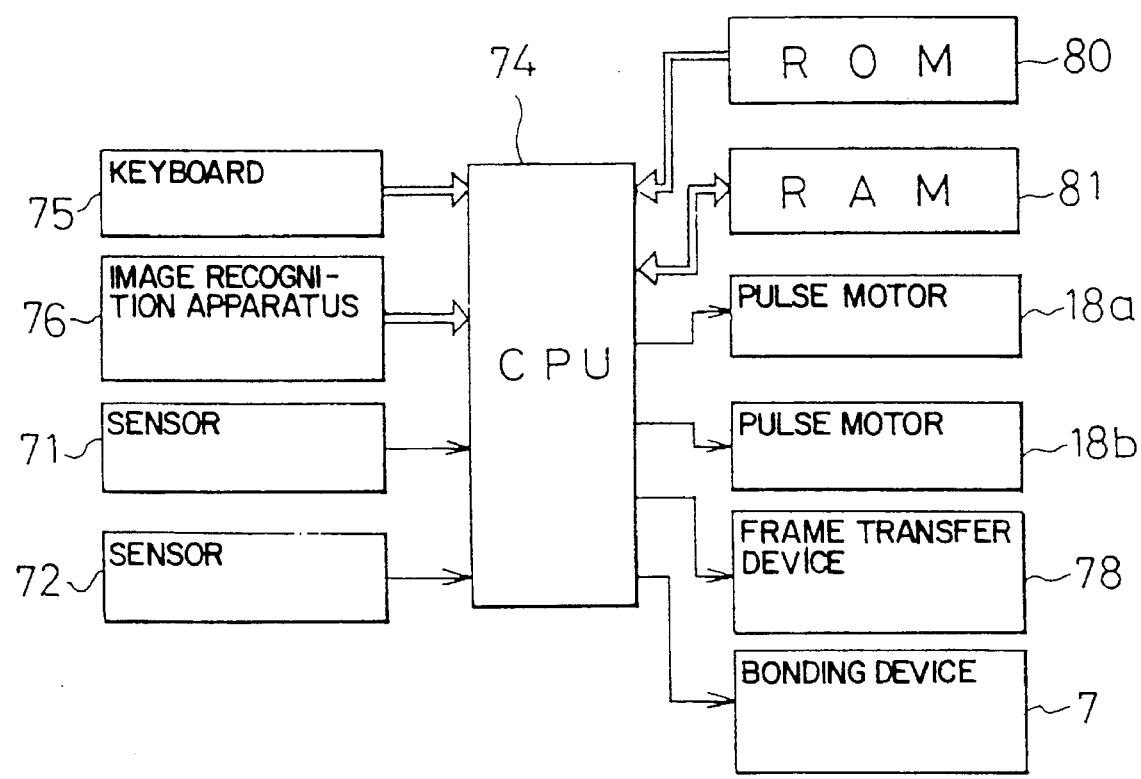
FIG. 41 is a block diagram showing the operational control system of the apparatus shown in FIG. 39.

As shown in FIG. 41, the detection signals emitted by each of the above-mentioned sensors 71 and 72 are sent to a controller (referred to as a CPU) 74 which governs operational control of said wire bonding apparatus. Said CPU 74 receives these signals along with signals transmitted by keyboard 75 and image recognition apparatus 76 (also shown in FIG. 40) and operates each pulse motor 18a and 18b, frame transfer device 78 (not shown in detail) and bonding device 7 with the timing as subsequently described.

Next, the following provides an explanation of operation in the case of changing the type of lead frame L/F handled in the wire bonding apparatus having the above-mentioned constitution. In this case, CPU 74 (see FIG. 41) reads work procedural data input in advance to ROM (Read Only Memory) 80, and then controls operation following the flow chart shown in FIG. 42 based on that data. In addition, data is input to and stored in RAM (Random Access Memory) 81 as subsequently described.

Figure 42:
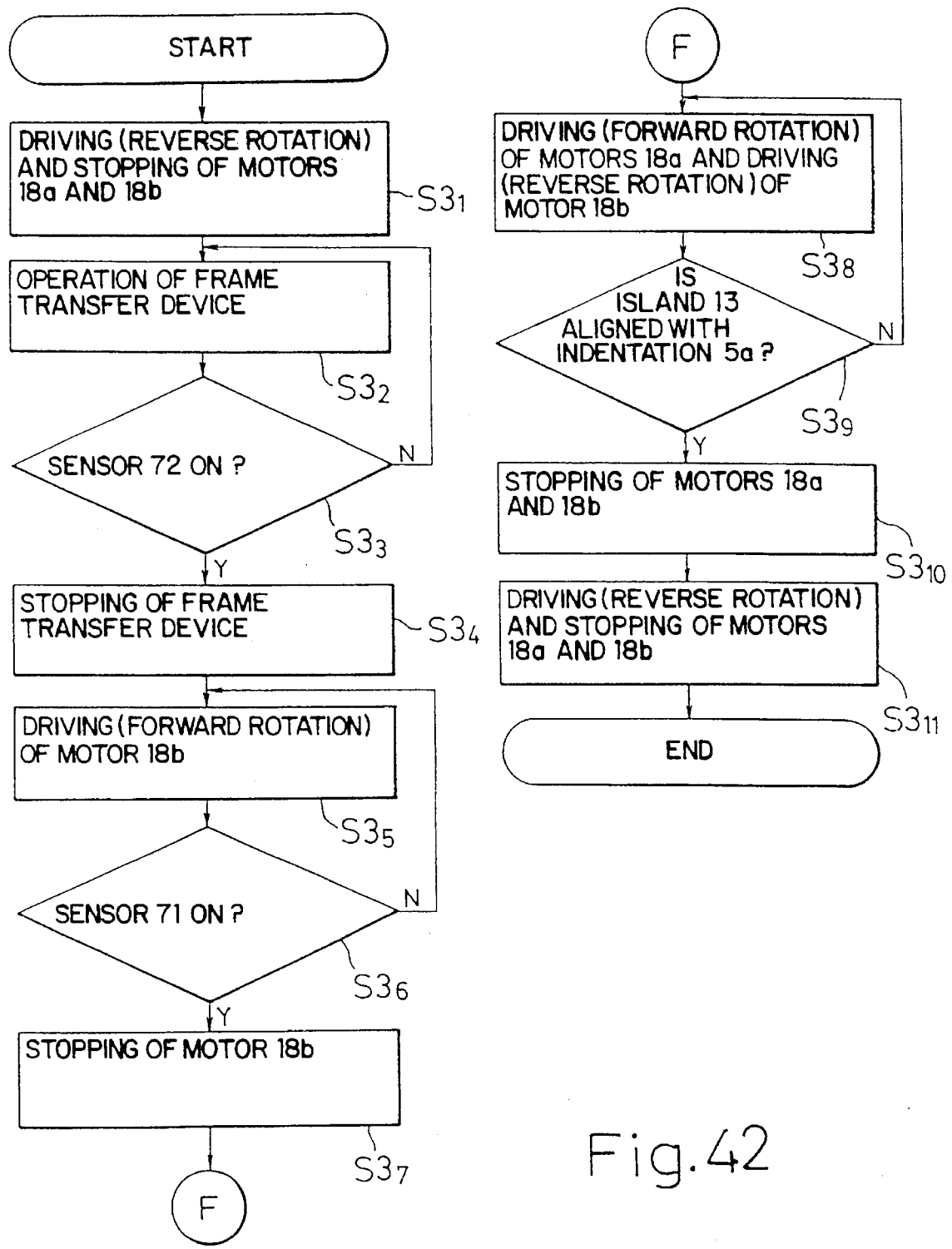
FIG. 42 is a flow chart representing the operation of the apparatus shown in FIG. 39.

To begin with, when a command signal is emitted by operation of keyboard 75 (see FIG. 41) and so forth, CPU 74 rotates both pulse motors 18a and 18b in reverse as shown in FIG. 42 to move both guide rails 11 and 12 to the movement limit position in the direction in which they move away from each other (direction opposite to arrows S and T) (Step $S3_1$). This movement limit position is set as the origin position of the operation of both guide rails 11 and 12.

Following this procedure, frame transfer device 78 (see FIG. 41) is operated (Step $S3_2$), lead frame L/F to be newly handled by the apparatus is brought between both guide rails 11 and 12 by said frame transfer device 78, and said frame transfer device 78 is then stopped at that position as a result of being detected by sensor 72 (Steps $S3_3$ and $S3_4$). Furthermore, it is desirable that both guide rails 11 and 12 be able to carry this supplied lead frame L/F even if they are at the above-mentioned movement limit position. In addition, the supplied lead frame L/F may be placed on heater plate 5.

Continuing, pulse motor 18b for driving one of the guide rails, namely guide rail 12, is rotated in the forward direction, said guide rail 12 is then moved toward the other guide rail 11 (direction of arrow T), and said pulse motor 18b is stopped based on a detection signal emitted by sensor 71 when lead frame L/F, pushed to the side of guide rail 11 by said guide rail 12, is detected by said sensor 71 (Steps $S3_5$ to $S3_7$). As a result, both guide rails 11 and 12 engage with lead frame L/F and enter a state wherein said guide rails 11 and 12 are able to guide lead frame L/F.

Pulse motor 18a is then rotated forward and the other pulse motor 18b is rotated in reverse (Step $S3_8$). As a result, both guide rails 11 and 12 are moved in synchronization, in the same direction (direction of arrow S for guide rail 11, opposite direction of arrow T for the other guide rail 12), at the same resolution and at the same speed, and stopped when center 84 in the direction of width is aligned with center 83 of the prescribed path over which lead frame L/F is to be guided, namely at the state wherein island 13 of lead frame L/F is aligned with indentation 5a of heater plate 5 (Steps $S3_9$ and $S3_{10}$).

Figure 43:
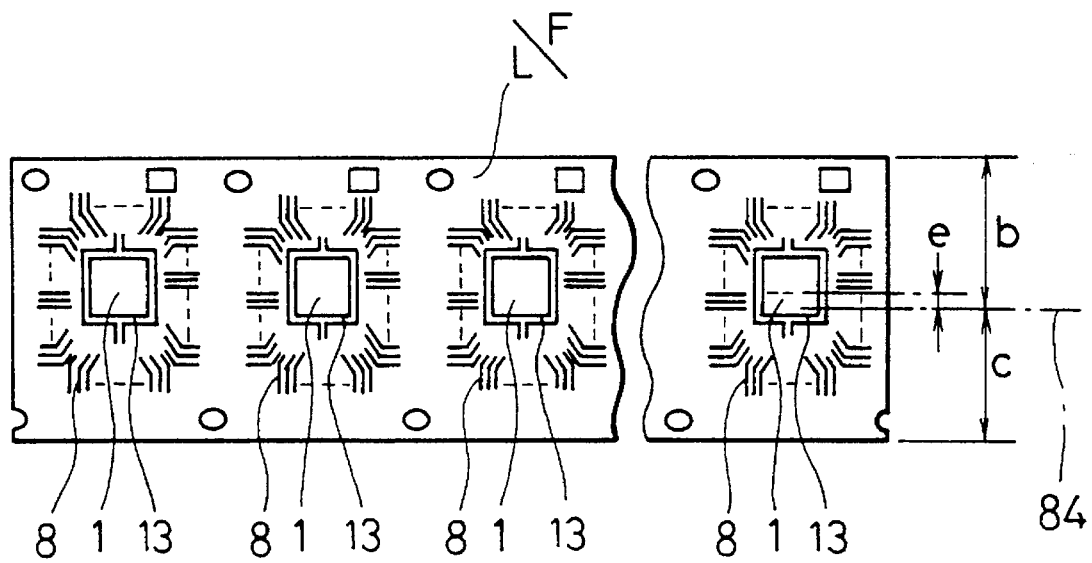
FIG. 43 is an overhead view of the lead frame to be handled in the apparatus shown in FIG. 39.

In this case, center 83 of the above-mentioned prescribed path refers to the center of indentation 5a. As shown in FIGS. 39 and 40, island 13 is aligned with indentation 5a as a result of aligning center 84 of the direction of width of lead frame L/F, on which said island 13 is arranged at its center of width, with this center 83 as described above. However, as shown in FIG. 43, in the case there are lead frames L/F formed in which island 13 is displaced by an amount e with respect to center 84 in the direction of width of said lead frames, and this type of lead frame is to be handled by the apparatus, it is necessary to align center 84 in the direction of width of lead frame L/F at a position displaced by the amount of that displacement e with respect to center 83 of the prescribed path when positioning lead frame L/F by moving both guide rails 11 and 12 in the same direction as described above to align island 13 with indentation 5a.

Furthermore, in addition to confirmation that center island 13 is aligned with indentation 5a being performed by an image signal obtained from image recognition apparatus 76 being sent to CPU 74, it is also performed by the operator himself visually monitoring a microscope (not shown), arranged at a position above lead frame L/F, or a monitor television (not shown) connected to said image recognition apparatus 76.

In addition, when both guide rails 11 and 12 are moved in the same direction so as to align island 13 with indentation 5a as described above, the amount of movement of both guide rails 11 and 12 is set to W/2 if the amount of movement from the origin position to the stopping position of only guide rail 12 performed in the previous step is taken to be W. As a result, after island 13 is nearly precisely positioned with respect to indentation 5a, high-precision positioning is performed by fine adjustment of the positions of guide rails 11 and 12 while confirming with the above-mentioned image and so forth.

Figure 44:
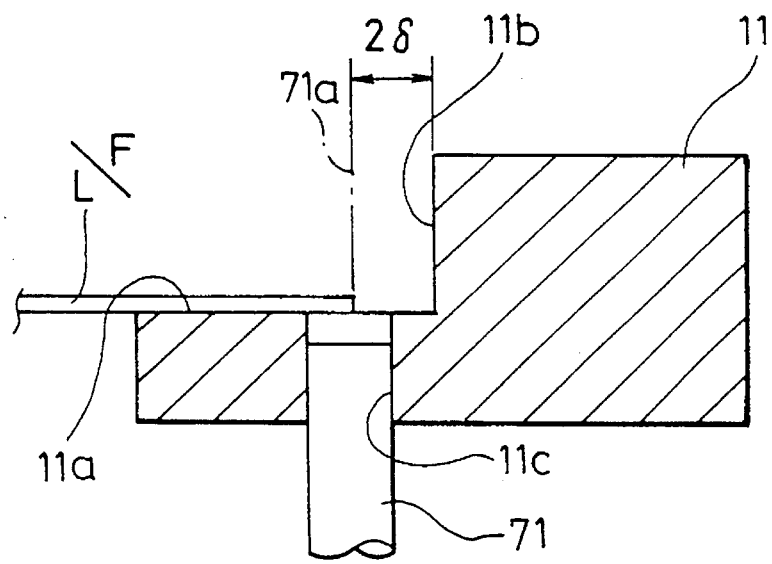
FIG. 44 is a longitudinal cross-sectional view showing a variation of a portion of the apparatus shown in FIGS. 39 and 40.

Once island 13 has been aligned with indentation 5a as described above, pulse motors 18a and 18b are each rotated slightly in reverse as shown in FIG. 42 (Step $S3_{11}$). As a result, the optimum gap δ is provided between vertical receiving surfaces 11b and 12b equipped on both guide rails 11 and 12 and both side edges of lead frame L/F as shown in FIG. 40, thereby allowing transport of lead frame L/F. Furthermore, as shown in FIG. 44, if sensor 71 is installed so that optical axis 71a of its irradiated light is at the position roughly twice the above-mentioned δ from receiving surface 11b of guide rail 11, and the side edge of lead frame L/F is detected by this, the above-mentioned guide rail operation for providing said gap δ is not necessary.

Thus, adjustment of the transport path corresponding to the lead frames L/F to be handled by the apparatus is completed.

When the position of lead frame L/F has been set in the manner described above, CPU 74 inputs and stores that set position in RAM 81. When the same type of lead frame L/F is handled by the apparatus again, CPU 74 recalls this stored data and immediately performs position setting.

When adjustment in the direction of frame width as described above is completed, setting of the position of lead frame L/F in the direction along the above-mentioned prescribed path, namely the direction of feeding, is performed according to the procedure described below.

To begin with, the frame transfer device (see FIG. 41) is operated which results in lead frame L/F being fed a minute distance at a time. Operation is then stopped at the point island 13 precisely aligns with indentation 5a in the direction of this feeding while CPU 74 or the operator confirms this state in the same manner as during the above-mentioned adjustment in the direction of frame width. When setting of the position of lead frame L/F in the direction of feeding is completed in this manner, CPU 74 stores this set position in RAM 81, and reproduces said set position as necessary by recalling this stored data from said RAM 81.

Furthermore, although the origin positions of both guide rails 11 and 12 are set at the movement limit positions in the direction in which said guide rails 11 and 12 move away from each other in the present embodiment, said origin positions can also be set at arbitrary positions. For example, if there is a lead frame that has been transported before the lead frame to be newly handled by the apparatus, the position that coincides with this prior lead frame may be used as the origin position, thereby enabling the position which coincides with a new lead frame to be computed based on this origin position.

In addition, adjustment of the transport path can also be performed while following the positions of the guide rails according to the images and so forth obtained from image recognition apparatus 76 without setting origin positions as described above.

In addition, although the adjustment operation is performed in the present embodiment by making one of the guide rails, namely guide rail 11, stationary and moving only the other guide rail, namely guide rail 12, prior to moving both guide rails 11 and 12 in the same direction to align island 13 with indentation 5a, conversely, said guide rail 12 may be made to be stationary while moving guide rail 11, or both guide rails 11 and 12 may be operated together.

Moreover, although sensor 71 is provided in the present embodiment for detecting that guide rails 11 and 12 have reached the state where they are able to guide lead frame L/F by engaging with said lead frame L/F, said sensor 71 is not required if this detection is performed by using image recognition apparatus 76 and so forth.

In addition, in the case it becomes necessary to replace heater plate 5 when handling a certain type of lead frame L/F, and indentation 5a of said heater plate 5 ends being displaced from island 13 of lead frame L/F as a result of performing that replacement, since it is only necessary to perform an operation which aligns island 13 with indentation 5a by moving both guide rails 11 and 12 in the same direction, adjustment can be performed extremely quickly and easily.

In addition, although the adjustment of the transport path of lead frames in a wire bonding apparatus is indicated in the present embodiment, it goes without saying that the present invention can also be applied to other apparatuses and substrates.

As has been explained above, according to the present invention, adjustment of a transport path can be performed automatically both quickly and easily, thus offering the advantage of reducing the burden on the operator.

What is claimed is:

1. A substrate transport apparatus comprising:

guide members which are able to freely approach and move away from each other, and which are arranged to support first and second sides of a substrate so as to guide said substrate along a prescribed path;

guide member driving devices which move each of said guide members;

a first detection device which detects that said guide members are in contact with said substrate and are positioned to guide said substrate;

a substrate containment device coupled to one end of said guide members, said substrate containment device containing said substrate when said substrate is not being guided by said guide members;

regulating members which regulate the position of the substrate containment device by mutually approaching and moving away;

regulating member driving devices which move each of said regulating members; and a second detection device which detects that said regulating members have regulated the position of said substrate containment device.

2. The substrate transport apparatus according to claim 1, wherein said first detection device comprises:

a first sensor for detecting whether said substrate is located on said guide members.

3. The substrate transport apparatus according to claim 2, wherein said first detection device further comprises:

a second sensor for detecting whether said guide members are positioned to guide said substrate, said guide member driving devices moving said guide members in accordance with detections of said second sensor.

4. The substrate transport apparatus according to claim 2, wherein said first detection device further comprises:

a signal generation device which generates signals corresponding to an amount of operation of the signal generation device, wherein a cessation of said signals indicates that said guide members are positioned to guide said substrate.

5. The substrate transport apparatus according to claim 4, wherein said signal generation device comprises an encoder.

6. The substrate transport apparatus according to claim 2, wherein said first detection device further comprises:

image recognition means for detecting whether said guide members are positioned to guide said substrate.

7. The substrate transport apparatus according to claim 1, wherein said second detection device comprises:

a sensor for detecting whether said regulating members have regulated the position of said substrate containment device, said regulating member driving devices moving said regulating members in accordance with detections of said sensor.

8. The substrate transport apparatus according to claim 1, wherein said second detection device comprises:

a signal generation device which generates signals corresponding to an amount of operation of said signal generating device, wherein a cessation of said signals indicates that said regulating members have regulated the position of said substrate containment device.

9. The substrate transport apparatus according to claim 8, wherein said signal generation device comprises an encoder.

10. The substrate transport apparatus according to claim 1, wherein said second detection device comprises:

image recognition means for detecting whether said regulating members have regulated the position of the substrate containment device.

* * * * *